US009966930B2

(12) United States Patent
Broyde et al.

(10) Patent No.: US 9,966,930 B2
(45) Date of Patent: May 8, 2018

(54) METHOD FOR AUTOMATICALLY ADJUSTING A TUNING UNIT, AND AUTOMATIC TUNING SYSTEM USING THIS METHOD

(71) Applicant: Samsung Electronics Co., Ltd., Suwon-si, Gyeonggi-do (KR)

(72) Inventors: Frédéric Broyde, Maule (FR); Evelyne Clavelier, Maule (FR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days. days.

(21) Appl. No.: 15/299,800

(22) Filed: Oct. 21, 2016

(65) Prior Publication Data

US 2017/0063344 A1 Mar. 2, 2017

Related U.S. Application Data

(63) Continuation of application No. PCT/IB2015/057161, filed on Sep. 17, 2015.

(30) Foreign Application Priority Data

Aug. 26, 2015 (FR) ...................... 15 01780

(51) Int. Cl.
*H04L 25/03* (2006.01)
*H03H 11/30* (2006.01)
(Continued)

(52) U.S. Cl.
CPC .............. *H03H 11/30* (2013.01); *H01Q 5/50* (2015.01); *H03H 7/40* (2013.01); *H04B 1/0475* (2013.01);
(Continued)

(58) Field of Classification Search
CPC ........ H01Q 9/0442; H01Q 2/00; H04B 7/022; H04B 7/0404; H04B 5/00; H04B 1/00;
(Continued)

(56) References Cited

U.S. PATENT DOCUMENTS 2,523,791 A 9/1950 Vahle et al.
2,745,067 A 5/1956 True et al.
(Continued)

FOREIGN PATENT DOCUMENTS

FR 2996067 A1 3/2014
FR 3004604 A1 10/2014
(Continued)

OTHER PUBLICATIONS

Broyde et al, "Some Properties of Multiple-Antenna-Port and Multiple-User-Port Antenna Tuners", IEEE Trans. on Circuits and Systems—I: Regular Papers, vol. 62, No. 2, pp. 423-432, Feb. 2015.
(Continued)

*Primary Examiner* — Khai Tran
(74) *Attorney, Agent, or Firm* — Jefferson IP Law, LLP

(57) ABSTRACT

The invention relates to a method for automatically adjusting a multiple-input-port and multiple-output-port tuning unit, for instance a multiple-input-port and multiple-output-port tuning unit coupled to the antennas of a radio transceiver using a plurality of antennas simultaneously. An automatic tuning system using this method has 4 user ports and 4 target ports, and comprises: 4 sensing units; a signal processing unit, the signal processing unit estimating real quantities depending on an impedance matrix seen by the target ports, using sensing unit output signals, the signal processing unit delivering a tuning instruction; a multiple-input-port and multiple-output-port tuning unit comprising adjustable impedance devices; and a tuning control unit receiving the tuning instruction and delivering tuning con-
(Continued)

trol signals to the multiple-input-port and multiple-output-port tuning unit, the reactance of each of the adjustable impedance devices being mainly determined by one or more of the tuning control signals.

20 Claims, 6 Drawing Sheets

(51) Int. Cl.
*H04B 1/04* (2006.01)
*H03H 7/40* (2006.01)
*H01Q 5/50* (2015.01)
*H04B 7/0413* (2017.01)

(52) U.S. Cl.
CPC .......... *H04B 1/0458* (2013.01); *H04B 7/0413* (2013.01); *H04B 2001/045* (2013.01)

(58) Field of Classification Search
CPC ......... H04B 1/40; H04F 1/3247; H04F 1/324; H03H 11/34
USPC .......... 375/297, 267; 330/84, 126, 147, 148; 455/273, 276.1
See application file for complete search history.

(56) References Cited

U.S. PATENT DOCUMENTS

| | | | |
|---|---|---|---|
| 3,443,231 A | 5/1969 | Roza | |
| 4,356,458 A | 10/1982 | Armitage | |
| 4,493,112 A | 1/1985 | Bruene | |
| 5,225,847 A | 7/1993 | Roberts et al. | |
| 5,564,086 A | 10/1996 | Cygan et al. | |
| 6,414,562 B1 | 7/2002 | Bouisse et al. | |
| 8,072,285 B2 | 12/2011 | Spears et al. | |
| 8,299,867 B2 | 10/2012 | McKinzie | |
| 9,077,317 B2 | 7/2015 | Broyde et al. | |
| 2013/0154894 A1* | 6/2013 | Caimi | H01Q 1/243 343/858 |
| 2014/0175895 A1 | 6/2014 | Ishi et al. | |
| 2017/0040674 A1* | 2/2017 | Suh | H04B 1/006 |

FOREIGN PATENT DOCUMENTS

| | | | |
|---|---|---|---|
| FR | 3018637 A1 | 9/2015 | |
| FR | 3018973 A1 | 9/2015 | |
| FR | 3021813 A1 | 12/2015 | |
| WO | WO2008/030165 A1 | 3/2008 | |
| WO | WO 2014/049475 A2 | 4/2014 | |
| WO | WO 2014/170766 A1 | 10/2014 | |
| WO | WO2015/136409 A1 | 9/2015 | |
| WO | WO2015/140660 A1 | 9/2015 | |
| WO | WO2015/181653 A1 | 12/2015 | |

OTHER PUBLICATIONS

Broyde et al, "A New Multiple-Antenna-Port and Multiple-User-Port Antenna Tuner", proceedings of the 2015 IEEE Radio & Wireless Week, RWW 2015, Jan. 2015.

Broyde et al, "Two Multiple-Antenna-Port and Multiple-User-Port Antenna Tuners", proceedings of the 9th European Conference on Antenna and Propagation, EuCAP 2015, Apr. 2015.

Search report for International Application No. PCT/IB2015/057161.

Written opinion for International Application No. PCT/IB2015/057161.

* cited by examiner

METHOD FOR AUTOMATICALLY ADJUSTING A TUNING UNIT, AND AUTOMATIC TUNING SYSTEM USING THIS METHOD

CROSS REFERENCE TO RELATED APPLICATIONS

This is a Continuation Application of PCT application No. PCT/IB2015/057161, filed 17 Sep. 2015, entitled "Method for automatically adjusting a tuning unit, and automatic tuning system using this method", which in turn claims priority to French patent application No. 15/01780 of 26 Aug. 2015, entitled "Procédé pour régler automatiquement une unité d'accord, et système d'accord automatique utilisant ce procédé", both of which are incorporated herein by reference.

FIELD OF THE INVENTION

The invention relates to a method for automatically adjusting a multiple-input-port and multiple-output-port tuning unit, for instance a multiple-input-port and multiple-output-port tuning unit coupled to the antennas of a radio transceiver using a plurality of antennas simultaneously. The invention also relates to an automatic tuning system using this method.

PRIOR ART

Tuning an impedance means obtaining that an impedance presented by an input port of a device approximates a wanted impedance, and simultaneously offering an ideally lossless, or nearly lossless, transfer of power from the input port to an output port of the device, in a context where the impedance seen by the output port may vary. Thus, if a signal generator presenting an impedance equal to the complex conjugate of the wanted impedance is connected to the input port, it will deliver a maximum power to the input port, this maximum power being referred to as "available power", and the output port will deliver a power near this maximum power.

A single-input-port and single-output-port tuning unit behaves, at any frequency in a given frequency band, with respect to its input port and output port, substantially as a passive linear 2-port device. Here, "passive" is used in the meaning of circuit theory, so that the single-input-port and single-output-port tuning unit does not provide amplification. A single-input-port and single-output-port tuning unit comprises one or more adjustable impedance devices each having an adjustable reactance. Adjusting a single-input-port and single-output-port tuning unit means adjusting the reactance of one or more of its adjustable impedance devices. Two examples of a single-input-port and single-output-port tuning unit are presented in the prior art section of the French patent application No. 12/02542 of 25 Sep. 2012, entitled "Appareil d'accord d'antenne pour un réseau d'antennes à accès multiple" and in the corresponding international application PCT/IB2013/058423 of 10 Sep. 2013, entitled "Antenna tuning apparatus for a multiport antenna array", where each of these examples is designated as an antenna tuning apparatus which could be used to tune a single antenna. A single-input-port and single-output-port tuning unit may be used for tuning an impedance. To tune an impedance, the single-input-port and single-output-port tuning unit must be properly adjusted.

Many methods and apparatuses for automatically tuning an impedance have been described, which use one or more real quantities depending on the impedance presented by the input port, these real quantities being processed to obtain "tuning control signals", the tuning control signals being used to control the reactances of the adjustable impedance devices of a single-input and single-output tuning unit.

For instance, in an apparatus for automatically tuning an impedance disclosed in the patent of the U.S. Pat. No. 2,523,791, entitled "Automatic Tuning System", in an apparatus for automatically tuning an impedance disclosed in the U.S. Pat. No. 2,745,067, entitled "Automatic Impedance Matching Apparatus", and in an apparatus for automatically tuning an impedance disclosed in the patent of the U.S. Pat. No. 3,443,231, entitled "Impedance Matching System", the wanted impedance is a resistance. We shall use $R_0$ to denote this resistance. In each of these apparatuses, a voltage v and a current i are sensed at a given point in a circuit, the impedance presented by the input port being $Z=v/i$. In each of these apparatuses, the real quantities depending on the impedance presented by the input port are a voltage determined by the phase of v relative to i, this phase being equal to the argument of Z, and a voltage substantially proportional to the difference $|v|-R_0|i|$. In each of these apparatuses, the second real quantity depending on the impedance presented by the input port is substantially equal to zero if the impedance presented by the input port is substantially equal to the wanted impedance, but the converse is not true. In the case of said U.S. Pat. No. 2,745,067 and U.S. Pat. No. 3,443,231, the two real quantities depending on the impedance presented by the input port are substantially equal to zero if and only if the impedance presented by the input port is substantially equal to the wanted impedance. In the case of said U.S. Pat. No. 3,443,231, two other real quantities representative of an impedance other than the impedance presented by the input port are also used to obtain the tuning control signals.

For instance, in an apparatus for automatically tuning an impedance disclosed in the patent of the U.S. Pat. No. 4,356,458, entitled "Automatic Impedance Matching Apparatus" and in an apparatus for automatically tuning an impedance disclosed in the patent of the U.S. Pat. No. 5,225,847 entitled "Automatic Antenna Tuning System", two voltages are sensed: a voltage substantially proportional to the absolute value of a complex incident voltage (an incident voltage is also referred to as forward voltage), and a voltage substantially proportional to the absolute value of a complex reflected voltage. Using the same notations as above, $v_F$ to denote the complex incident voltage, and $v_R$ to denote the complex reflected voltage, the specialist understands that said absolute values are given by $|v_F|=|v+R_0i|/2$ and by $|v_R|=|v-R_0i|/2$, respectively. In each of these apparatuses, a single real quantity depending on the impedance presented by the input port is used. It is a number processed in a digital circuit. In one of these apparatuses, this number is substantially equal to the ratio of the absolute value of the complex reflected voltage to the absolute value of the complex incident voltage, that is to say, to $|v_R|/|v_F|$. In the other of these apparatuses, this number is substantially equal to the squared inverse of this ratio, that is to say, to $|v_F|^2/|v_R|^2$.

For instance, in an apparatus for automatically tuning an impedance disclosed in the patent of the U.S. Pat. No. 4,493,112, entitled "Antenna Tuner Discriminator", two complex voltages are sensed: a voltage substantially proportional to an incident voltage, and a voltage substantially proportional to a reflected voltage. Using the incident voltage as reference for the phase, a voltage proportional to the real part of the reflected voltage and a voltage proportional to the imaginary part of the reflected voltage are obtained. In this apparatus, the real quantities depending on the impedance presented by the input port are the voltage proportional to the real part of the reflected voltage and the voltage proportional to the imaginary part of the reflected voltage. In this apparatus, the two real quantities depending on the impedance presented by the input port are substantially equal to zero if and only if the impedance presented by the input port is substantially equal to the wanted impedance.

We note that, in the apparatuses disclosed in said U.S. Pat. No. 4,356,458 and U.S. Pat. No. 5,225,847, a digital feedback loop involving sequential logic must be used to obtain the tuning control signals and tune the impedance presented by the input port, because the single real quantity depending on the impedance presented by the input port does not provide a full information on the impedance presented by the input port. In the other apparatuses considered above, a faster tuning can be obtained, because two real quantities depending on the impedance presented by the input port provide a full information on the impedance presented by the input port, so that a simple degenerative feedback loop can be used to obtain the tuning control signals and tune the impedance presented by the input port. However, the specialist understands that an apparatus for automatically tuning an impedance using two real quantities depending on the impedance presented by the input port, providing a full information on the impedance presented by the input port, could achieve the fastest tuning if, based on this full information obtained at a given time, it computes the values of the tuning control signals needed to obtain an exact tuning and quickly delivers the corresponding tuning control signals.

When the input port is intended to be coupled to the radio-frequency signal port of a wireless receiver or of a wireless transmitter, an apparatus for automatically tuning an impedance is sometimes referred to as "automatic antenna tuner" or as "adaptive impedance matching module", for instance in the patent of the U.S. Pat. No. 8,072,285, entitled "Method for tuning an adaptive impedance matching network with a look-up table", or in the patent of the U.S. Pat. No. 8,299,867, entitled "Adaptive impedance matching module". An apparatus for automatically tuning an impedance is indeed adaptive, in the sense that some circuit parameters, namely the reactances of adjustable impedance devices, are varied with time as a function of circuit variables such as sensed voltages or currents.

Tuning an impedance matrix means obtaining that an impedance matrix presented by a plurality of input ports of a device approximates a wanted impedance matrix, and simultaneously offering an ideally lossless, or nearly lossless, transfer of power from the plurality of input ports to a plurality of output ports of the device, in a context where the impedance matrix seen by the plurality of output ports may vary. Thus, if the ports of a multiport signal generator presenting an impedance matrix equal to the hermitian adjoint (that is to say a matrix equal to the matrix transpose of the matrix complex conjugate) of the wanted impedance matrix are suitably connected to the plurality of input ports, said multiport signal generator delivers a maximum power to the plurality of input ports, this maximum power being referred to as "available power", and the plurality of output ports delivers a power near this maximum power.

A multiple-input-port and multiple-output-port tuning unit behaves, at any frequency in a given frequency band, with respect to its m input ports and n output ports, substantially as a passive linear (n+m)-port device. Here, "passive" is used in the meaning of circuit theory, so that the multiple-input-port and multiple-output-port tuning unit does not provide amplification. A multiple-input-port and multiple-output-port tuning unit comprises several adjustable impedance devices each having an adjustable reactance. Adjusting a multiple-input-port and multiple-output-port tuning unit means adjusting the reactance of one or more of its adjustable impedance devices. Examples of a multiple-input-port and multiple-output-port tuning unit are disclosed in said French patent application No. 12/02542 and said corresponding international application PCT/IB2013/058423, each of these examples being designated as an "antenna tuning apparatus for a multiport antenna array". A multiple-input-port and multiple-output-port tuning unit may be used to tune an impedance matrix. To tune an impedance matrix, the multiple-input-port and multiple-output-port tuning unit must be properly adjusted.

The specialist understands that a plurality of apparatuses for automatically tuning an impedance can be used to automatically tune an impedance matrix, in the special case where the interactions between the ports of a multiport load coupled to the output ports of the plurality of apparatuses are very small, and where the wanted impedance matrix is diagonal. This approach cannot be used for automatically tuning an impedance matrix, in the case where the interactions between the ports of a multiport load coupled to the output ports are not very small, that is to say in the case where the impedance matrix seen by the output ports is not substantially diagonal.

The French patent application No. 13/00878 of 15 Apr. 2013, entitled "Procédé et appareil pour accorder automatiquement une matrice impédance, et émetteur radio utilisant cet appareil", corresponding to the international application No. PCT/IB2014/058933 of 12 Feb. 2014 and to the patent of the U.S. Pat. No. 9,077,317, both entitled "Method and apparatus for automatically tuning an impedance matrix, and radio transmitter using this apparatus", discloses a method for automatically tuning an impedance matrix. To tune an impedance matrix of size m by m, this method estimates real quantities depending on the impedance matrix presented by the input ports, using excitations applied successively to the input ports. This method can be used for automatically adjusting a multiple-input-port and multiple-output-port tuning unit. Unfortunately, this method requires very complex computations or many iterations, because there is no direct relationship between the real quantities depending on the impedance matrix presented by the input ports and the reactance value that each of the adjustable impedance devices should take on after having been adjusted. Moreover, it can be shown that an adjustment of a multiple-input-port and multiple-output-port tuning unit obtained using this method need not be optimal when the losses in the multiple-input-port and multiple-output-port tuning unit are not very small.

Consequently, there is no known solution to the problem of optimally and automatically adjusting a multiple-input-port and multiple-output-port tuning unit without very complex computations, or without many iterations, or when the losses in the multiple-input-port and multiple-output-port tuning unit are not very small.

SUMMARY OF THE INVENTION

The purpose of the invention is a method for automatically adjusting a multiple-input-port and multiple-outputport tuning unit, without the above-mentioned limitations of known techniques, and also an automatic tuning system using this method.

In what follows, "having an influence" and "having an effect" have the same meaning.

The method of the invention is a method for automatically adjusting a multiple-input-port and multiple-output-port tuning unit, the multiple-input-port and multiple-output-port tuning unit being a part of an automatic tuning system having m "user ports" and n "target ports", where m is an integer greater than or equal to 2 and where n is an integer greater than or equal to 2, the automatic tuning system allowing, at a given frequency, a transfer of power from the user ports to the target ports, the multiple-input-port and multiple-output-port tuning unit comprising p adjustable impedance devices, where p is an integer greater than or equal to m, the p adjustable impedance devices being referred to as "the adjustable impedance devices of the tuning unit" and being such that, at said given frequency, each of the adjustable impedance devices of the tuning unit has a reactance, the reactance of any one of the adjustable impedance devices of the tuning unit having an influence on an impedance matrix presented by the user ports, the reactance of any one of the adjustable impedance devices of the tuning unit being adjustable by electrical means, the method comprising the steps of:

applying m excitations to the user ports, one and only one of the excitations being applied to each of the user ports;

estimating q real quantities depending on an impedance matrix seen by the target ports, where q is an integer greater than or equal to m, using said m excitations;

using said q real quantities depending on an impedance matrix seen by the target ports, to obtain "tuning control signals"; and applying each of the tuning control signals to one or more of the adjustable impedance devices of the tuning unit, the reactance of each of the adjustable impedance devices of the tuning unit being mainly determined by one or more of the tuning control signals.

According to the invention, the given frequency is for instance a frequency greater than or equal to 150 kHz. We will use $Z_{Sant}$ to denote the impedance matrix seen by the target ports. The specialist understands that $Z_{Sant}$ is a complex matrix of size n by n. Said transfer of power from the user ports to the target ports may be a transfer of power with small or negligible or zero losses, this characteristic being preferred.

As explained below in the presentations of the second and third embodiments, said m excitations can be used to estimate the q real quantities depending on an impedance matrix seen by the target ports. The specialist understands that this characteristic of the method of the invention cannot be obtained with the plurality of apparatuses for automatically tuning an impedance, used to tune an impedance matrix, as presented above in the prior art section. The specialist also understands that this characteristic of the method of the invention avoids the interferences which wreak havoc on the operation of a plurality of apparatuses for automatically tuning an impedance, used to tune an impedance matrix, in the case where the interactions between the ports of a multiport load coupled to their output ports are not very small.

According to the invention, each of said q real quantities depending on an impedance matrix seen by the target ports may for instance be a real quantity representative of the impedance matrix seen by the target ports.

According to the invention, each of said q real quantities depending on an impedance matrix seen by the target ports may for instance be substantially proportional to the absolute value, or the phase, or the real part, or the imaginary part of an entry of the impedance matrix seen by the target ports, or of an entry of the inverse of the impedance matrix seen by the target ports (that is, the admittance matrix seen by the target ports), or of an entry of a matrix of the voltage reflection coefficients at the target ports, defined as being equal to $(Z_{Sant}-Z_O)(Z_{Sant}+Z_O)^{-1}$, where $Z_O$ is a reference impedance matrix.

The specialist sees a fundamental difference between the prior art method disclosed in said French patent application No. 13/00878, international application No. PCT/IB2014/058933 and U.S. Pat. No. 9,077,317, on the one part, and the invention, on the other part. In said prior art method, real quantities depending on the impedance matrix presented by the user ports are used for automatically tuning the impedance matrix presented by the user ports, this matrix being of size m by m and denoted by $Z_U$. This means that said prior art method uses a closed-loop control scheme, in which the real quantities depending on $Z_U$ are used to obtain tuning control signals, which determine the reactance of each of the adjustable impedance devices of the tuning unit, and therefore determine $Z_U$. In contrast, the method of the invention uses an open-loop control scheme, in which the real quantities depending on $Z_{Sant}$ are used to obtain tuning control signals, the tuning control signals having no influence on $Z_{Sant}$.

The section III of the article of F. Broydé and E. Clavelier entitled "Some Properties of Multiple-Antenna-Port and Multiple-User-Port Antenna Tuners", published in *IEEE Trans. on Circuits and Systems—I: Regular Papers*, Vol. 62, No. 2, pp. 423-432, in February 2015, explains that there exists a mapping denoted by $f_U$ and defined by $$f_U(Z_{Sant}, X_1, \ldots, X_p) = Z_U \qquad (1)$$

where, the adjustable impedance devices of the tuning unit being numbered from 1 to p, for any integer j greater than or equal to 1 and less than or equal to p, we use $X_j$ to denote the reactance of the adjustable impedance device of the tuning unit number j, at the given frequency. Here, $Z_{Sant}$ is of course independent of the real variables $X_1, \ldots, X_p$, whereas the equation (1) shows that $Z_U$ depends on the real variables $X_1, \ldots, X_p$. This allows us to clarify said fundamental difference between said prior art method and the invention, in both of which each of the real variables $X_1, \ldots, X_p$ is mainly determined by one or more of the tuning control signals. Said prior art method uses a closed-loop control scheme because it is such that the real quantities depending on $Z_U$ are used to obtain the tuning control signals and consequently to determine the real variables $X_1, \ldots, X_p$, and thus to modify $Z_U$ according to equation (1). In contrast, the invention uses an open-loop control scheme because it is such that the real quantities depending on $Z_{Sant}$ are used to obtain the tuning control signals and consequently to determine the real variables $X_1, \ldots, X_p$, which have no influence on $Z_{Sant}$.

According to the invention, since the real quantities depending on $Z_{Sant}$ are used to obtain the tuning control signals and consequently to determine the real variables $X_1, \ldots, X_p$, the equation (1) indicates that the tuning control signals can be used to control $Z_U$, if the mapping $f_U$ is known. More generally, the tuning control signals can be used to control $Z_U$, using a suitable model of the multiple-input-port and multiple-output-port tuning unit. Thus, according to the invention, it is possible that the tuning control signals are such that the impedance matrix presented by the user ports, computed using the equation (1), decreases or minimizes a norm of the image of the impedance matrix presented by the user ports under a matrix function, the matrix function being a function from a set of square complex matrices into the same set of square complex matrices. For instance, this norm may be a vector norm or a matrix norm. For instance, if we define a wanted impedance matrix, the wanted impedance matrix being denoted by $Z_W$, said matrix function may be defined by $$g(Z_U) = Z_U - Z_W \qquad (2)$$

in which case the image of $Z_U$ under the matrix function is a difference of impedance matrices, or by $$g(Z_U) = Z_U^{-1} - Z_W^{-1} \qquad (3)$$

in which case the image of $Z_U$ under the matrix function is a difference of admittance matrices, or by $$g(Z_U) = (Z_U - Z_W)(Z_U + Z_W)^- \qquad (4)$$

in which case the image of $Z_U$ under the matrix function is a matrix of the voltage reflection coefficients at the user ports. We note that each of these matrix functions is such that $g(Z_W)$ is a null matrix, so that the norm of $g(Z_W)$ is zero.

An adjustable impedance device is a component comprising two terminals which substantially behave as the terminals of a passive linear two-terminal circuit element, and which are consequently fully characterized by an impedance which may depend on frequency, this impedance being adjustable. An adjustable impedance device may be adjustable by mechanical means, for instance a variable resistor, a variable capacitor, a network comprising a plurality of capacitors and one or more switches or change-over switches used to cause different capacitors of the network to contribute to the reactance, a variable inductor, a network comprising a plurality of inductors and one or more switches or change-over switches used to cause different inductors of the network to contribute to the reactance, or a network comprising a plurality of open-circuited or short-circuited stubs and one or more switches or change-over switches used to cause different stubs of the network to contribute to the reactance. We note that all examples in this list, except the variable resistor, are intended to provide an adjustable reactance.

An adjustable impedance device having a reactance which is adjustable by electrical means may be such that it only provides, at said given frequency, a finite set of reactance values, this characteristic being for instance obtained if the adjustable impedance device is:

a network comprising a plurality of capacitors or open-circuited stubs and one or more electrically controlled switches or change-over switches, such as electromechanical relays, or microelectromechanical switches (MEMS switches), or PIN diodes or insulated-gate field-effect transistors (MOSFETs), used to cause different capacitors or open-circuited stubs of the network to contribute to the reactance; or a network comprising a plurality of coils or short-circuited stubs and one or more electrically controlled switches or change-over switches used to cause different coils or short-circuited stubs of the network to contribute to the reactance.

An adjustable impedance device having a reactance which is adjustable by electrical means may be such that it provides, at said given frequency, a continuous set of reactance values, this characteristic being for instance obtained if the adjustable impedance device is based on the use of a variable capacitance diode; or a MOS varactor; or a microelectromechanical varactor (MEMS varactor); or a ferroelectric varactor.

The method of the invention may be such that any diagonal entry of the impedance matrix presented by the user ports is influenced by the reactance of at least one of the adjustable impedance devices of the tuning unit. The method of the invention may be such that the reactance of at least one of the adjustable impedance devices of the tuning unit has an influence on at least one non-diagonal entry of the impedance matrix presented by the user ports. The specialist understands that this characteristic avoids the limited tuning capability of a plurality of apparatuses for automatically tuning an impedance, used to tune the impedance matrix of a plurality of ports, mentioned above in the prior art section. This question will be explored further in the presentations of the first and sixth embodiments.

An apparatus implementing the method of the invention is an automatic tuning system having m "user ports" and n "target ports", where m is an integer greater than or equal to 2 and where n is an integer greater than or equal to 2, the automatic tuning system allowing, at a given frequency, a transfer of power from the user ports to the target ports, the automatic tuning system comprising:

at least n sensing units, each of the sensing units delivering one or more "sensing unit output signals", each of the sensing unit output signals being mainly determined by one or more electrical variables;

a signal processing unit, the signal processing unit estimating q real quantities depending on an impedance matrix seen by the target ports, where q is an integer greater than or equal to m, using the sensing unit output signals obtained for m excitations applied to the user ports, one and only one of the excitations being applied to each of the user ports, the signal processing unit delivering a "tuning instruction" as a function of said q real quantities depending on an impedance matrix seen by the target ports;

a multiple-input-port and multiple-output-port tuning unit, the multiple-input-port and multiple-output-port tuning unit comprising p adjustable impedance devices, where p is an integer greater than or equal to m, the p adjustable impedance devices being referred to as "the adjustable impedance devices of the tuning unit" and being such that, at said given frequency, each of the adjustable impedance devices of the tuning unit has a reactance, the reactance of any one of the adjustable impedance devices of the tuning unit having an influence on an impedance matrix presented by the user ports, the reactance of any one of the adjustable impedance devices of the tuning unit being adjustable by electrical means; and a tuning control unit, the tuning control unit receiving the tuning instruction from the signal processing unit, the tuning control unit delivering "tuning control signals" to the multiple-input-port and multiple-output-port tuning unit, the tuning control signals being determined as a function of the tuning instruction, the reactance of each of the adjustable impedance devices of the tuning unit being mainly determined by one or more of the tuning control signals.

For instance, each of said electrical variables may be a voltage, or an incident voltage, or a reflected voltage, or a current, or an incident current, or a reflected current. For instance, each of said electrical variables may be sensed at one of said target ports, or at a port of the multiple-input-port and multiple-output-port tuning unit, or inside the multiple-input-port and multiple-output-port tuning unit.

Said multiple-input-port and multiple-output-port tuning unit comprises m input ports and n output ports. It is assumed that said multiple-input-port and multiple-output-port tuning unit behaves, at said given frequency, with respect to its input ports and output ports, substantially as a passive linear device, where "passive" is used in the meaning of circuit theory. More precisely, said multiple-input-port and multiple-output-port tuning unit behaves, at said given frequency, with respect to the n output ports and the m input ports, substantially as a passive linear (n+m)-port device. As a consequence of linearity, it is possible to define the impedance matrix presented by the input ports. As a consequence of passivity, the multiple-input-port and multiple-output-port tuning unit does not provide amplification.

It is possible that each of the m input ports of the multiple-input-port and multiple-output-port tuning unit is coupled, directly or indirectly, to one and only one of the m user ports, and that each of the m user ports is coupled, directly or indirectly, to one and only one of the m input ports of the multiple-input-port and multiple-output-port tuning unit. It is possible that each of the n output ports of the multiple-input-port and multiple-output-port tuning unit is coupled, directly or indirectly, to one and only one of the n target ports, and that each of the n target ports is coupled, directly or indirectly, to one and only one of the n output ports of the multiple-input-port and multiple-output-port tuning unit. Thus, said transfer of power from the user ports to the target ports may take place through the multiple-input-port and multiple-output-port tuning unit. The integer p may be greater than or equal to 2m.

The specialist understands that the automatic tuning system of the invention is adaptive in the sense that circuit parameters, namely the reactances of the adjustable impedance devices of the tuning unit, are varied with time as a function of the sensing unit output signals, which are each mainly determined by one or more electrical variables.

The specialist understands that the tuning instruction may for instance be determined as being a tuning instruction which, among a set of possible tuning instructions, produces an impedance matrix presented by the user ports, computed using (1), which decreases or minimizes a norm of the image of the impedance matrix presented by the user ports under a matrix function, the matrix function being for instance one of the matrix functions g such that $g(Z_U)$ is given by the equation (2) or the equation (3) or the equation (4). The specialist also understands that the tuning instruction may for instance be determined as being a tuning instruction which provides an impedance matrix presented by the user ports, computed using (1), which is substantially equal to the wanted impedance matrix, for instance a tuning instruction such that $Z_U = Z_W$.

BRIEF DESCRIPTION OF THE DRAWINGS

Other advantages and characteristics will appear more clearly from the following description of particular embodiments of the invention, given by way of non-limiting examples, with reference to the accompanying drawings in which.

DETAILED DESCRIPTION OF SOME EMBODIMENTS

First Embodiment

Figure 1:
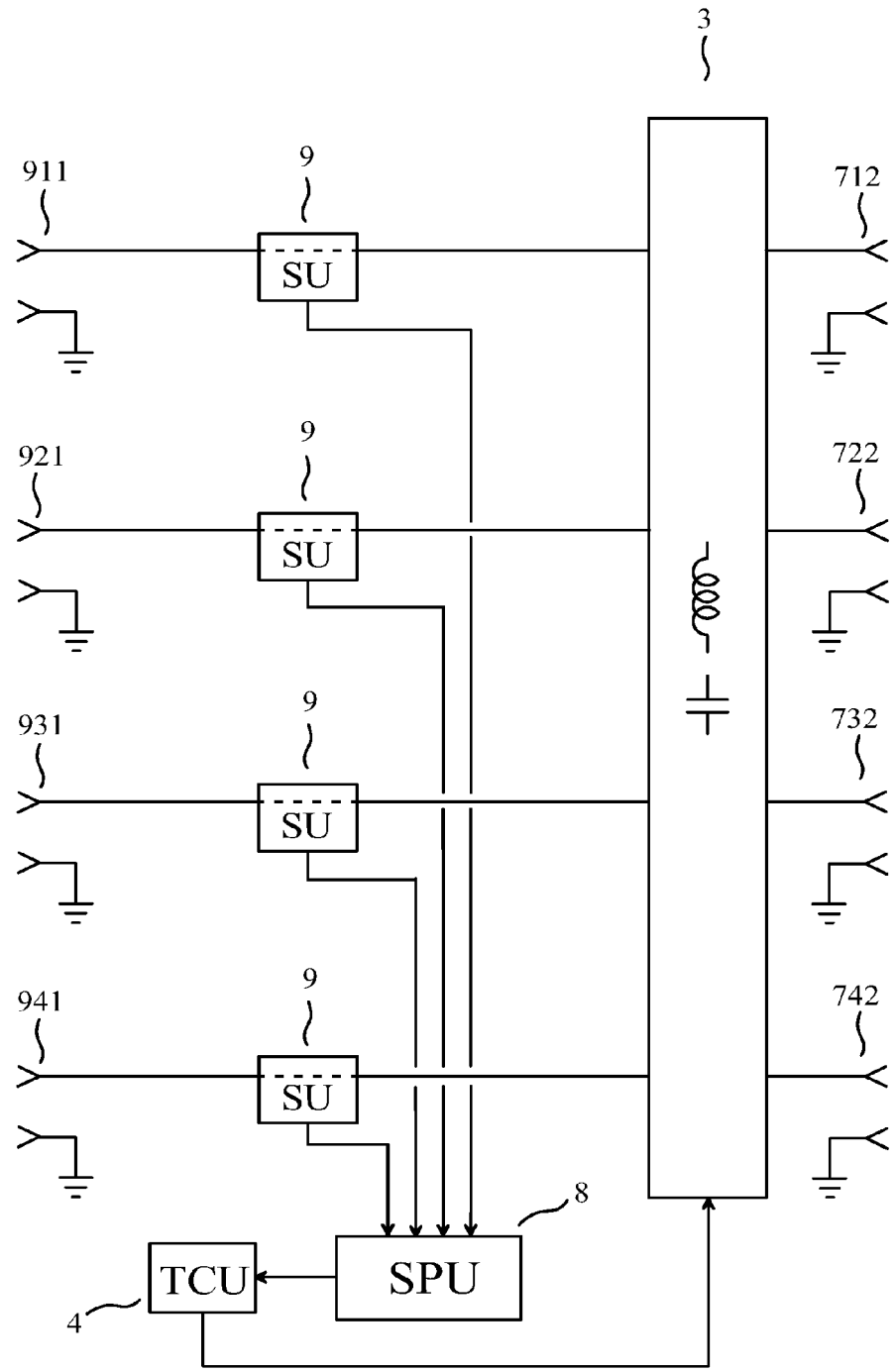
FIG. 1 shows the block diagram of an automatic tuning system having 4 user ports and 4 target ports (first embodiment)

As a first embodiment of a device of the invention, given by way of non-limiting example, we have represented in FIG. 1 the block diagram of an automatic tuning system having m=4 user ports (712) (722) (732) (742) and n=4 target ports (911) (921) (931) (941), the automatic tuning system allowing, at a given frequency greater than or equal to 30 MHz, a transfer of power from the user ports to the target ports, the automatic tuning system comprising:

n sensing units (9), each of the sensing units delivering two "sensing unit output signals", each of the sensing unit output signals being determined by one electrical variable;

a signal processing unit (8), the signal processing unit estimating q real quantities depending on an impedance matrix seen by the target ports, where q is an integer greater than or equal to m, using the sensing unit output signals obtained for m excitations applied to the user ports, one and only one of the excitations being applied to each of the user ports, the signal processing unit delivering a "tuning instruction" as a function of said q real quantities depending on an impedance matrix seen by the target ports;

a multiple-input-port and multiple-output-port tuning unit (3), the multiple-input-port and multiple-output-port tuning unit comprising p adjustable impedance devices, where p is an integer greater than or equal to 2m=8, the p adjustable impedance devices being referred to as "the adjustable impedance devices of the tuning unit" and being such that, at said given frequency, each of the adjustable impedance devices of the tuning unit has a reactance, the reactance of any one of the adjustable impedance devices of the tuning unit being adjustable by electrical means; and a tuning control unit (4), the tuning control unit receiving the tuning instruction from the signal processing unit (8), the tuning control unit delivering "tuning control signals" to the multiple-input-port and multiple-output-port tuning unit (3), the tuning control signals being determined as a function of the tuning instruction, the reactance of each of the adjustable impedance devices of the tuning unit being mainly determined by one or more of the tuning control signals.

Each of the sensing units (9) may for instance be such that the two sensing unit output signals delivered by said each of the sensing units comprise: a first sensing unit output signal proportional to a first electrical variable, the first electrical variable being a voltage across one of the target ports; and a second sensing unit output signal proportional to a second electrical variable, the second electrical variable being a current flowing out of said one of the target ports. Said voltage across one of the target ports may be a complex voltage and said current flowing out of said one of the target ports may be a complex current. Alternatively, each of the sensing units (9) may for instance be such that the two sensing unit output signals delivered by said each of the sensing units comprise: a first sensing unit output signal proportional to a first electrical variable, the first electrical variable being an incident voltage (which may also be referred to as "forward voltage") at one of the target ports; and a second sensing unit output signal proportional to a second electrical variable, the second electrical variable being a reflected voltage at said one of the target ports. Said incident voltage at one of the target ports may be a complex incident voltage and said reflected voltage at said one of the target ports may be a complex reflected voltage.

Each of the electrical variables is substantially zero if no excitation is applied to any one of the user ports and if no excitation is applied to any one of the target ports.

An external device has m output ports, each of the output ports of the external device being coupled to one and only one of the user ports, each of the user ports being coupled to one and only one of the output ports of the external device. The external device is not shown in FIG. 1. The external device applies m excitations to the user ports. The external device also delivers "instructions of the external device" to the signal processing unit (8), said instructions of the external device informing the signal processing unit that said excitations have been applied, or are being applied, or will be applied. For instance, the external device may initiate a tuning sequence when it informs the signal processing unit that it will apply the excitations to the user ports. For instance, the signal processing unit may end the tuning sequence when, after the excitations have been applied, a tuning instruction has been delivered. Additionally, the external device provides other signals to the signal processing unit, and/or receives other signals from the signal processing unit. The electrical links needed to deliver said instructions of the external device and to carry such other signals are not shown in FIG. 1.

The multiple-input-port and multiple-output-port tuning unit (3) is an antenna tuning apparatus disclosed in said French patent application No. 12/02542 and in said international application PCT/IB2013/058423, having m input ports and n output ports. Thus, the multiple-input-port and multiple-output-port tuning unit is such that the reactance of any one of the adjustable impedance devices of the tuning unit has, at said given frequency, if the impedance matrix seen by the target ports is equal to a given diagonal impedance matrix, an influence on the impedance matrix presented by the user ports, and such that the reactance of at least one of the adjustable impedance devices of the tuning unit has, at said given frequency, if the impedance matrix seen by the target ports is equal to the given diagonal impedance matrix, an influence on at least one non-diagonal entry of the impedance matrix presented by the user ports. This must be interpreted as meaning: the multiple-input-port and multiple-output-port tuning unit is such that, at said given frequency, there exists a diagonal impedance matrix referred to as the given diagonal impedance matrix, the given diagonal impedance matrix being such that, if an impedance matrix seen by the target ports is equal to the given diagonal impedance matrix, then (a) the reactance of any one of the adjustable impedance devices of the tuning unit has an influence on an impedance matrix presented by the user ports, and (b) the reactance of at least one of the adjustable impedance devices of the tuning unit has an influence on at least one non-diagonal entry of the impedance matrix presented by the user ports.

Moreover, the multiple-input-port and multiple-output-port tuning unit (3) is such that, at said given frequency, if the impedance matrix seen by the target ports is equal to a given non-diagonal impedance matrix, a mapping associating the impedance matrix presented by the user ports to the p reactances is defined, the mapping having, at a given value of each of the p reactances, a partial derivative with respect to each of the p reactances, a span of the p partial derivatives being defined in the set of the complex matrices of size m by m considered as a real vector space, any diagonal complex matrix of size m by m having the same diagonal entries as at least one element of the span of the p partial derivatives. This must be interpreted as meaning: the multiple-input-port and multiple-output-port tuning unit is such that, at said given frequency, there exists a non-diagonal impedance matrix referred to as the given non-diagonal impedance matrix, the given non-diagonal impedance matrix being such that, if an impedance matrix seen by the target ports is equal to the given non-diagonal impedance matrix, then a mapping associating an impedance matrix presented by the user ports to the p reactances is defined, the mapping having, at a given value of each of the p reactances, a partial derivative with respect to each of the p reactances, a span of the p partial derivatives being defined in the set of the complex matrices of size m by m considered as a real vector space, any diagonal complex matrix of size m by m having the same diagonal entries as at least one element of the span of the p partial derivatives.

Thus, the specialist understands that any small variation in the impedance matrix seen by the target ports can be at least partially compensated with a new automatic adjustment of the adjustable impedance devices of the tuning unit.

The specialist knows that the dimension of the span of the p partial derivatives considered as a real vector space has been used and explained: in said French patent application No. 12/02542; in said international application PCT/IB2013/058423; and in the sections I, III, VI, VII and VIII of the article of F. Broydé and E. Clavelier entitled "Some Properties of Multiple-Antenna-Port and Multiple-User-Port Antenna Tuners", published in *IEEE Trans. on Circuits and Systems—I: Regular Papers*, Vol. 62, No. 2, pp. 423-432, in February 2015. In this article, said dimension of the span of the p partial derivatives is referred to as the local dimension of the user port impedance range, and denoted by $D_{UR}$ ($Z_{Sant}$). A specialist understands that, to obtain that any diagonal complex matrix of size m by m has the same diagonal entries as at least one element of the span of the p partial derivatives, it is necessary that the dimension of the span of the p partial derivatives considered as a real vector space is greater than or equal to the dimension of the subspace of the diagonal complex matrices of size m by m considered as a real vector space. Since the dimension of the span of the p partial derivatives considered as a real vector space is less than or equal to p, and since the dimension of the subspace of the diagonal complex matrices of size m by m considered as a real vector space is equal to 2m, the necessary condition implies that p is an integer greater than or equal to 2m. This is why the requirement "p is an integer greater than or equal to 2m" is an essential characteristic of this embodiment.

The signal processing unit (8) may also estimate one or more quantities each depending on the power delivered by the target ports. For instance, such quantities each depending on the power delivered by the target ports may be used to control the power delivered by the target ports.

The characteristics of the multiple-input-port and multiple-output-port tuning unit (3) are such that the automatic tuning system allows, at said given frequency, a low-loss transfer of power from the user ports to the target ports, and a low-loss transfer of power from the target ports to the user ports.

If the automatic tuning system has each of its target ports coupled to one and only one of the ports of a multiport antenna array, the specialist understands that $Z_{Sant}$ depends on the frequency and on the electromagnetic characteristics of the volume surrounding the antennas. In particular, if the multiport antenna array is built in a portable transceiver, for instance a user equipment (UE) of an LTE wireless network, the body of the user has an effect on $Z_{Sant}$, and $Z_{Sant}$ depends on the position of the body of the user. This is referred to as "user interaction", or "hand effect" or "finger effect". The specialist understands that the automatic tuning system may be used to compensate a variation in $Z_{Sant}$ caused by a variation in the frequency of operation, and/or to compensate the user interaction.

In order to respond to variations in $Z_{Sant}$ and/or in the operating frequency, the tuning instruction may be generated repeatedly. For instance, a new tuning sequence ending with the delivery of a new tuning instruction may start periodically, for instance every 10 milliseconds.

In this first embodiment, n=m=4. Thus, it is possible that n is greater than or equal to 3, it is possible that n is greater than or equal to 4, it is possible that m is greater than or equal to 3, and it is possible that m is greater than or equal to 4.

Second Embodiment

The second embodiment of a device of the invention, given by way of non-limiting example, also corresponds to the automatic tuning system having m=4 user ports and n=4 target ports shown in FIG. 1, and all explanations provided for the first embodiment are applicable to this second embodiment. Additionally, in this second embodiment, the m excitations are applied successively to the user ports, that is to say: the m excitations are applied one after another to the user ports. Thus, for instance, it is not possible that two or more of the excitations are applied simultaneously. Each of them excitations applied successively to the user ports may for instance comprise a sinusoidal signal at said given frequency, for instance a sinusoidal current at said given frequency applied to one and only one of the user ports, said one and only one of the user ports being a different user port for each of the m excitations. Each of the m excitations applied successively to the user ports may for instance comprise a sinusoidal signal at a frequency different from said given frequency, or a non-sinusoidal signal.

The external device successively applies the m different excitations to the user ports. For instance, if the user ports are numbered from 1 to m, if the different excitations are numbered from 1 to m, and if a is any integer greater than or equal to 1 and less than or equal to m, the excitation number a may consist of a voltage applied to the user port number a and no voltage applied to the other user ports, or consist of a current applied to the user port number a and no current applied to the other user ports.

In this second embodiment, $q=2n^2$ and the q real quantities depending on an impedance matrix seen by the target ports fully determine the impedance matrix seen by the target ports. Also, the two sensing unit output signals of each of said sensing units are proportional to a complex voltage across one of the target ports and to a complex current flowing out of said one of the target ports, respectively, as explained above. To explain how the signal processing unit (8) can use the sensing unit output signals obtained for m different excitations applied successively to the user ports, to estimate q real quantities depending on an impedance matrix seen by the target ports, we are going to consider two examples of signal processing.

In the first example of signal processing, we assume that, for any integer a greater than or equal to 1 and less than or equal to m, the excitation number a consists of a current at the given frequency applied to the user port number a and no current applied to the other user ports. For a given tuning instruction, the target ports present an impedance matrix $Z_{LIOC}$, and the excitation number a causes a vector of the open-circuit voltages at the target ports, denoted by $V_{TPOC\ a}$. Here, $Z_{LIOC}$ is a complex matrix of size n by n and $V_{TPOC\ a}$ is a complex vector of size n by 1. The specialist sees that, while the excitation number a is being applied, the vector of the complex currents measured by the sensing units is given by $$I_{TP\ a} = (Z_{Sant} + Z_{LIOC})^{-1} V_{TPOC\ a} \quad (5)$$

and the vector of the complex voltages measured by the sensing units is given by $$V_{TP\ a} = Z_{Sant} I_{TP\ a} \quad (6)$$

in which $I_{TP\ a}$ is given by the equation (5).

Let $I_{TP}$ be the complex matrix of size n by m whose column vectors are $I_{TP\ 1}, \ldots, I_{TP\ m}$, and let $V_{TP}$ be the complex matrix of size n by m whose column vectors are $V_{P\ 1}, \ldots, V_{TP\ m}$. We have $$V_{TP} = Z_{Sant} I_{TP} \quad (7)$$

In this embodiment, m=n, and the multiple-input-port and multiple-output-port tuning unit (3) is such that $I_{TP}$ is invertible, so that $$Z_{Sant} = V_{TP} I_{TP}^{-1} \quad (8)$$

Since, for each entry of $V_{TP}$ or of $I_{TP}$, one of the sensing unit output signals is, while one of the excitations is being applied, proportional to this entry of $V_{TP}$ or of $I_{TP}$, the signal processing unit can use the equation (8) to compute $Z_{Sant}$. Thus, in the first example of signal processing, said q real quantities depending on an impedance matrix seen by the target ports may consist of $n^2$ real numbers each proportional to the real part of an entry of $Z_{Sant}$ and of $n^2$ real numbers each proportional to the imaginary part of an entry of $Z_{Sant}$.

In the second example of signal processing, we assume that, for any integer a greater than or equal to 1 and less than or equal to m, the excitation number a consists of a voltage at the given frequency applied to the user port number a and no voltage applied to the other user ports. For a given tuning instruction, the target ports present an impedance matrix $Z_{LISC}$, and the excitation number a causes a vector of the open-circuit voltages at the target ports, denoted by $V_{TPSC\ a}$. Here, $Z_{LISC}$ is a complex matrix of size n by n and $V_{TPSC\ a}$ is a complex vector of size n by 1. The specialist sees that, while the excitation number a is being applied, the vector of the complex currents measured by the sensing units is given by $$I_{TP\ a} = (Z_{Sant} + Z_{LISC})^{-1} V_{TPSC\ a} \quad (9)$$

and the vector of the complex voltages measured by the sensing units is given by the equation (6) in which $I_{TP\ a}$ is given by the equation (9). Let $I_{TP}$ be the complex matrix of size n by m whose column vectors are $I_{TP\ 1}, \ldots, I_{TP\ m}$, and let $V_{TP}$ be the complex matrix of size n by m whose column vectors are $V_{TP\ 1}, \ldots, V_{TP\ m}$. The matrices $I_{TP}$ and $V_{TP}$ of this second example of signal processing may be completely different from the matrices $I_{TP}$ and $V_{TP}$ of the first example of signal processing. However, they satisfy the equation (7). The multiple-input-port and multiple-output-port tuning unit (3) being such that $I_{TP}$ is invertible, the matrices $I_{TP}$ and $V_{TP}$ of this second example of signal processing also satisfy the equation (8), so that the signal processing unit can use the equation (8) to compute $Z_{Sant}$. Thus, in the second example of signal processing, said q real quantities depending on an impedance matrix seen by the target ports may consist of $n^2$ real numbers each proportional to the real part of an entry of $Z_{Sant}$ and of $n^2$ real numbers each proportional to the imaginary part of an entry of $Z_{Sant}$. Alternatively, said q real quantities depending on an impedance matrix seen by the target ports may consist of $n^2$ real numbers each proportional to the absolute value of an entry of $Z_{Sant}$ and of $n^2$ real numbers each proportional to the argument of an entry of $Z_{Sant}$.

The tuning instruction may be of any type of digital message. In this second embodiment, an adaptive process is carried out by the signal processing unit, during one or more tuning sequences. The adaptive process is the following: during each of said tuning sequences, the signal processing unit estimates the q real quantities depending on an impedance matrix seen by the target ports, and uses an algorithm to determine the tuning instruction, the tuning instruction being such that the impedance matrix presented by the user ports is substantially equal to a wanted impedance matrix. The algorithm is based on the frequency of operation and on the q real quantities depending on an impedance matrix seen by the target ports. A possible algorithm, for a multiple-input-port and multiple-output-port tuning unit having a particular structure, may for instance use the formulas shown in Section VI of said paper entitled "Some Properties of Multiple-Antenna-Port and Multiple-User-Port Antenna Tuners". The adaptive process carried out by the signal processing unit requires neither complex computations nor any iteration because the algorithm directly uses the q real quantities depending on an impedance matrix seen by the target ports and the frequency of operation to determine the tuning instruction (so that there is a direct relationship between the real quantities depending on an impedance matrix seen by the target ports and the reactance value that each of the adjustable impedance devices of the tuning unit should take on after being adjusted).

Third Embodiment

The third embodiment of a device of the invention, given by way of non-limiting example, also corresponds to the automatic tuning system having m=4 user ports and n=4 target ports shown in FIG. 1, and all explanations provided for the first embodiment are applicable to this third embodiment. Additionally, in this third embodiment, the m excitations are not applied successively to the user ports, that is to say: the m excitations are not applied one after another to the user ports. Thus, for instance, it is possible that two or more of the excitations are applied simultaneously to the user ports. Thus, for instance, it is possible that the m excitations are applied simultaneously to the user ports.

Moreover, each of the excitations is a bandpass signal. This type of signal is sometimes improperly referred to as "passband signal" or "narrow-band signal" (in French: "signal à bande étroite"). A bandpass signal is any real signal s(t), where t denotes the time, such that the spectrum of s(t) is included in a frequency interval $[f_C-W/2, f_C+W/2]$, where $f_C$ is a frequency referred to as "carrier frequency" and where W is a frequency referred to as "bandwidth", which satisfies $W<2f_C$. Thus, the Fourier transform of s(t), denoted by S(f), is non-negligible only in the frequency intervals $[-f_C-W/2, -f_C+W/2]$ and $[f_C-W/2, f_C+W/2]$. The complex envelope of the real signal s(t), also referred to as "complex baseband equivalent" or "baseband-equivalent signal", is a complex signal $s_B(t)$ whose Fourier transform $S_B(f)$ is non-negligible only in the frequency interval $[-W/2, W/2]$ and satisfies $S_B(f)=k\ S(f_C+f)$ in this interval, where k is a real constant which is chosen equal to the square root of 2 by some authors. The real part of $s_B(t)$ is referred to as the in-phase component, and the imaginary part of $s_B(t)$ is referred to as the quadrature component. The specialist knows that the bandpass signal s(t) may for instance be obtained:

as the result of a phase and amplitude modulation of a single carrier at the frequency $f_C$;

as a linear combination of a first signal and a second signal, the first signal being the product of the in-phase component and a first sinusoidal carrier of frequency $f_C$, the second signal being the product of the quadrature component and a second sinusoidal carrier of frequency $f_C$, the second sinusoidal carrier being 90° out of phase with respect to the first sinusoidal carrier;

in other ways, for instance without using any carrier, for instance using directly a filtered output of a digital-to-analog converter.

The frequency interval $[f_C-W/2, f_C+W/2]$ is a passband of the bandpass signal. From the definitions, it is clear that, for a given bandpass signal, several choices of carrier frequency $f_C$ and of bandwidth W are possible, so that the passband of the bandpass signal is not uniquely defined. However, any passband of the bandpass signal must contain any frequency at which the spectrum of s(t) is not negligible.

The complex envelope of the real signal s(t) clearly depends on the choice of a carrier frequency $f_C$. However, for a given carrier frequency, the complex envelope of the real signal s(t) is uniquely defined, for a given choice of the real constant k.

One and only one of said m excitations is applied to each of the user ports, two or more of the excitations being applied simultaneously. Each of said m excitations is a bandpass signal having a passband which contains said given frequency. Said given frequency being considered as a carrier frequency, each of the excitations has one and only one complex envelope (or complex baseband equivalent), the m complex envelopes of the m excitations being linearly independent in E, where E is the set of complex functions of one real variable, regarded as a vector space over the field of complex numbers.

Let us number the user ports from 1 to m, and let us number the excitations from 1 to m, in such a way that, if a is an integer greater than or equal to 1 and less than or equal to m, the excitation number a is applied to the user port number a. For instance, if we use t to denote time, the excitations may be such that, for any integer a greater than or equal to 1 and less than or equal to m, the excitation number a consists of a current $i_a(t)$, of complex envelope $i_{E\ a}(t)$, applied to the user port number a, the complex envelopes $i_{E\ 1}(t), \ldots, i_{E\ m}(t)$ being linearly independent in E. It is possible to show that, if the bandwidth of the complex envelopes $i_{E\ 1}(t), \ldots, i_{E\ m}(t)$ is sufficiently narrow, then for any integer a greater than or equal to 1 and less than or equal to m, any voltage or current measured at anyone of the target ports and caused by the excitation number a is a bandpass signal whose complex envelope is proportional to $i_{E\,a}(t)$, the coefficient of proportionality being complex and time-independent. Thus, if we use S to denote the span of $i_{E\,1}(t), \ldots, i_{E\,m}(t)$ in E, it is possible to say that: $i_{E\,1}(t), \ldots, i_{E\,m}(t)$ is a basis of S; any voltage or current measured at anyone of the target ports and caused by the excitations is a bandpass signal whose complex envelope lies in S; and, for any integer a greater than or equal to 1 and less than or equal to m, the product of the a-th coordinate of the complex envelope of this voltage or current in the basis $i_{E\,1}(t), \ldots, i_{E\,m}(t)$ and the vector $i_{E\,a}(t)$ is equal to the part of the complex envelope of this voltage or current which is caused by the excitation number a. Consequently, the contributions of the different excitations can be identified with suitable signal processing, as if the different excitations had been applied successively to the user ports. The specialist sees that, once this has been done, the first example of signal processing of the second embodiment can be adapted to the context of this third embodiment, to obtain the q real quantities depending on an impedance matrix seen by the target ports.

More precisely, in an example of signal processing, we assume that, as above, for any integer a greater than or equal to 1 and less than or equal to m, the excitation number a consists of a current $i_a(t)$, of complex envelope $i_{E\,a}(t)$, applied to the user port number a, the complex envelopes $i_{E\,1}(t), \ldots, i_{E\,m}(t)$ being linearly independent in E. For a given tuning instruction, the target ports present an impedance matrix $Z_{LIOC}$, and the excitations cause, at the target ports: n open-circuit voltages, of complex envelopes $v_{TPOC\,1}(t), \ldots, v_{TPOC\,n}(t)$; n currents flowing out of the target ports, of complex envelopes $i_{TP\,1}(t), \ldots, i_{TP\,n}(t)$; and n voltages across the target ports, of complex envelopes $v_{TP\,1}(t), \ldots, v_{TP\,n}(t)$. As explained above, if the bandwidth of the complex envelopes $i_{E\,1}(t), \ldots, i_{E\,m}(t)$ is sufficiently narrow, for any integer a greater than or equal to 1 and less than or equal to m, the product of the a-th coordinate of each of these complex envelopes in the basis $i_{E\,1}(t), \ldots, i_{E\,m}(t)$ and the vector $i_{E\,a}(t)$ is equal to the part of said each of these complex envelopes which is caused by the excitation number a. We can use $u_{TPOC\,a}$ to denote the column vector of the a-th coordinates of the complex envelopes $v_{TPOC\,1}(t), \ldots, v_{TPOC\,n}(t)$ in this basis. Likewise, we can use $j_{TP\,a}$ to denote the column vector of the a-th coordinates of the complex envelopes $i_{TP\,1}(t), \ldots, i_{TP\,n}(t)$ in this basis. Likewise, we can use $u_{TP\,a}$ to denote the column vector of the a-th coordinates of the complex envelopes $v_{TP\,1}(t), \ldots, v_{TP\,n}(t)$ in this basis. Here, $Z_{LIOC}$ is a complex matrix of size n by n, and $u_{TPOC\,a}$, $j_{TP\,a}$, and $u_{TP\,a}$ are complex vectors of size n by 1. The specialist sees that $$j_{TP\,a} = (Z_{Sant} + Z_{LIOC})^{-1} u_{TPOC\,a} \quad (10)$$

and $$u_{TP\,a} = Z_{Sant} j_{TP\,a} \quad (11)$$

Let $J_{TP}$ be the complex matrix of size n by m whose column vectors are $j_{TP\,1}, \ldots, j_{TP\,m}$, and let $U_{TP}$ be the complex matrix of size n by m whose column vectors are $u_{TP\,1}, \ldots, u_{TP\,m}$. We have $$U_{TP} = Z_{Sant} J_{TP} \quad (12)$$

In this embodiment, m=n, and the multiple-input-port and multiple-output-port tuning unit (3) is such that $J_{TP}$ is invertible, so that $$Z_{Sant} = U_{TP} J_{TP}^{-1} \quad (13)$$

The specialist understands how the sensing unit output signals can be processed to obtain the entries of $U_{TP}$ and of $J_{TP}$. For instance, let us assume that, for any integer b greater than or equal to 1 and less than or equal to n, the sensing unit number b delivers: a first sensing unit output signal proportional to the voltage across the target port number b; and a second sensing unit output signal proportional to the current flowing out of this target port. The signal processing unit may for instance perform an in-phase/quadrature (I/Q) demodulation (homodyne reception) of these sensing unit output signals, to obtain, for any integer b greater than or equal to 1 and less than or equal to n, four analog signals: the real part of $v_{TP\,b}(t)$; the imaginary part of $v_{TP\,b}(t)$; the real part of $i_{TP\,b}(t)$; and the imaginary part of $i_{TP\,b}(t)$. These analog signals may then be converted into digital signals and further processed in the digital domain, to estimate the coordinates of the complex envelope of the voltage across the target port number b in the basis $i_{E\,1}(t), \ldots, i_{E\,m}(t)$, that is to say the row b of $U_{TP}$, and to estimate the coordinates of the complex envelope of the current flowing out of the target port number b in the basis $i_{E\,1}(t), \ldots, i_{E\,m}(t)$, that is to say the row b of $J_{TP}$. In this manner, all entries of $U_{TP}$ and of $J_{TP}$ can be obtained.

Once the entries of $U_{TP}$ and of $J_{TP}$ have been obtained, the equation (13) can be used to compute $Z_{Sant}$. Thus, in this example of signal processing, said q real quantities depending on an impedance matrix seen by the target ports may consist of $n^2$ real numbers each proportional to the real part of an entry of $Z_{Sant}$ and of $n^2$ real numbers each proportional to the imaginary part of an entry of $Z_{Sant}$.

This example of signal processing shows that, in an embodiment where the m excitations are not applied successively, the effects of the different excitations can be identified with suitable signal processing, as if the different excitations had been applied successively to the user ports, so that the m excitations can be used to estimate the impedance matrix seen by the target ports, and any real quantity depending on the impedance matrix seen by the target ports.

We observe that, in standards typically applicable to MIMO wireless networks, signals having complex envelopes which are linearly independent in E are used as reference signals (also referred to as pilot signals) for MIMO channel estimation. We see that these signals used as reference signals, if they are applied to the user ports, can be used as excitations having complex envelopes which are linearly independent in E. Consequently, this third embodiment is compatible with the requirements of standards typically applicable to MIMO wireless networks. This question is further discussed below, in the fifth embodiment.

In this third embodiment, $q=2n^2$ and the q real quantities depending on an impedance matrix seen by the target ports fully determine the impedance matrix seen by the target ports. For instance, as said above, said q real quantities depending on an impedance matrix seen by the target ports may consist of $n^2$ real numbers each proportional to the real part of an entry of $Z_{Sant}$ and of $n^2$ real numbers each proportional to the imaginary part of an entry of $Z_{Sant}$. For instance, said q real quantities depending on an impedance matrix seen by the target ports may consist of $n^2$ real numbers each proportional to the absolute value of an entry of $Z_{Sant}$ and of $n^2$ real numbers each proportional to the argument of an entry of $Z_{Sant}$.

The tuning instruction may be of any type of digital message. In this third embodiment, an adaptive process is carried out by the signal processing unit, during one or more tuning sequences. The adaptive process is the following:

during each of said tuning sequences, the signal processing unit estimates the q real quantities depending on an impedance matrix seen by the target ports, and uses a lookup table (also spelled "look-up table") to determine the tuning instruction, based on the frequency of operation and on the q real quantities depending on an impedance matrix seen by the target ports. The specialist understands how to build and use such a lookup table. The lookup table is such that the adjustment of the multiple-input-port and multiple-output-port tuning unit is always optimal or almost optimal, in spite of the losses in the multiple-input-port and multiple-output-port tuning unit. Moreover, the adaptive process carried out by the signal processing unit requires neither complex computations nor any iteration because the lookup table directly uses the frequency of operation and the q real quantities depending on an impedance matrix seen by the target ports to determine the tuning instruction (so that there is a direct relationship between the real quantities depending on an impedance matrix seen by the target ports and the reactance value that each of the adjustable impedance devices of the tuning unit should take on after being adjusted).

Fourth Embodiment

The fourth embodiment of a device of the invention, given by way of non-limiting example, also corresponds to the automatic tuning system having m=4 user ports and n=4 target ports shown in FIG. 1, and all explanations provided for the first embodiment and for the third embodiment are applicable to this fourth embodiment. Additionally, in this fourth embodiment, the complex envelopes of the m excitations are orthogonal to each other. More precisely, the complex envelopes of the m excitations are orthogonal to one another, for a given scalar product. Moreover, the scalar product of any one of the m complex envelopes and itself is nonzero, so that the orthogonality requirements entail that the m complex envelopes are linearly independent. We may use $<f|g>$ to denote the scalar product of two functions $f$ and $g$, which may be any scalar product satisfying the properties of conjugate symmetry, linearity in the second argument, and positivity (we do not require positive definiteness). For instance, we may consider that each of said complex envelope is square-integrable, and that the scalar product is the usual scalar product of the Hilbert space of square-integrable functions of a real variable, which, for two square-integrable functions $f$ and $g$, is given by $$\langle f | g \rangle = \int_{-\infty}^{\infty} \overline{f(x)} g(x) dx \qquad (14)$$

in which the bar above $f(x)$ denotes the complex conjugate. Alternatively, we may for instance consider that two functions $f$ and $g$ are sampled at the same points in time, to obtain the samples $f[j]$ of $f$ and the samples $g[j]$ of $g$, where $j$ is an integer, and that the scalar product is the usual scalar product of finite energy sequences, which is given by $$\langle f | g \rangle = \sum_{j=-\infty}^{\infty} \overline{f[j]} g[j] \qquad (15)$$

Let us for instance consider the case in which the excitations are such that, for any integer a greater than or equal to 1 and less than or equal to m, the excitation number a consists of a current $i_a(t)$, of complex envelope $i_{E\ a}(t)$, applied to the user port number a, the complex envelopes $i_{E\ 1}(t), \ldots, i_{E\ m}(t)$ being orthogonal to each other. In this case, the equation (13) is applicable, and the entries of $U_{TP}$ and of $J_{TP}$ can be easily computed, since, for any integer a greater than or equal to 1 and less than or equal to m, and for any integer b greater than or equal to 1 and less than or equal to n, the entry of the row b and the column a of $J_{TP}$, that is to say the b-th entry of the vector $j_{TP\ a}$, that is to say the a-th coordinate of the complex envelope $i_{TP\ b}(t)$ in the basis $i_{E\ 1}(t), \ldots, i_{E\ m}(t)$, is clearly given by $$j_{ba} = \frac{\langle i_{E_a} | i_{TPb} \rangle}{\langle i_{E_a} | i_{E_a} \rangle} \qquad (16)$$

and the entry of the row b and the column a of $U_{TP}$, that is to say the b-th entry of the vector $u_{TP\ a}$, that is to say the a-th coordinate of the complex envelope $v_{TP\ b}(t)$ in said basis, is clearly given by $$u_{ba} = \frac{\langle i_{E_a} | v_{TPb} \rangle}{\langle i_{E_a} | i_{E_a} \rangle} \qquad (17)$$

For instance, let us assume that, for any integer b greater than or equal to 1 and less than or equal to n, the sensing unit number b delivers: a first sensing unit output signal proportional to the voltage across the target port number b; and a second sensing unit output signal proportional to the current flowing out of this target port. The signal processing unit may for instance perform a down-conversion of all sensing unit output signals, followed by an in-phase/quadrature (I/Q) demodulation (heterodyne reception), to obtain, for any integer b greater than or equal to 1 and less than or equal to n, four analog signals: the real part of $v_{TP\ b}(t)$; the imaginary part of $V_{TP\ b}(t)$; the real part of $i_{TP\ b}(t)$; and the imaginary part of $i_{TP\ b}(t)$. These analog signals may then be converted into digital signals and further processed in the digital domain, based on equations (16) and (17), to estimate all entries of $U_{TP}$ and of $J_{TP}$.

We have just considered, as an example, the case in which the excitations are such that, for any integer a greater than or equal to 1 and less than or equal to m, the excitation number a consists of a current $i_a(t)$, of complex envelope $i_{E\ a}(t)$, applied to the user port number a, the complex envelopes $i_{E\ 1}(t), \ldots, i_{E\ m}(t)$ being orthogonal to each other. We have shown that, in this case, the effects of the different excitations can be easily identified, as if the different excitations had been applied successively to the user ports, so that the m excitations can be used to estimate the impedance matrix seen by the target ports, and any real quantity depending on the impedance matrix seen by the target ports. Alternatively, the excitations could for instance be such that, for any integer a greater than or equal to 1 and less than or equal to m, the excitation number a consists of a voltage $V_a(t)$, of complex envelope $v_{E\ a}(t)$, applied to the user port number a, the complex envelopes $v_{E\ 1}(t), \ldots, v_{E\ m}(t)$ being orthogonal to each other. In this case, using a proof similar to the one presented above for applied currents, we can show that the effects of the different excitations can be easily identified, as if the different excitations had been applied successively to the user ports, so that the m excitations can be used to estimate the impedance matrix seen by the target ports, and any real quantity depending on the impedance matrix seen by the target ports.

The specialist understands how to generate m excitations having complex envelopes which are orthogonal to one another. For instance, let us consider m arbitrary sequences of data symbols, each sequence being modulated on a single sub-carrier of an orthogonal frequency division multiplexing (OFDM) signal, different sequences being modulated on different sub-carriers. These m modulated sub-carriers are orthogonal to one another, so that each of these modulated sub-carriers could be used as the complex envelope of one of the m excitations. For instance, orthogonality also exists between any two different resource elements of an OFDM signal (a resource element means one OFDM sub-carrier for the duration of one OFDM symbol), so that m different resource elements could each be used to obtain the complex envelope of one of the m excitations.

Fifth Embodiment (Best Mode)

The fifth embodiment of a device of the invention, given by way of non-limiting example and best mode of carrying out the invention, also corresponds to the automatic tuning system having m=4 user ports and n=4 target ports shown in FIG. 1, and all explanations provided for the first embodiment and for the third embodiment are applicable to this fifth embodiment. Additionally, in this fifth embodiment, each of the complex envelopes of the m excitations is the sum of a first complex signal and a second complex signal, the first complex signal being referred to as the primary component of the complex envelope, the second complex signal being referred to as the secondary component of the complex envelope, the primary components of the m complex envelopes being orthogonal to each other, each of the primary components of the m complex envelopes being orthogonal to each of the secondary components of the m complex envelopes. More precisely, the primary components of the m complex envelopes are orthogonal to one another, for a given scalar product, and each of the primary components of the m complex envelopes is orthogonal to each of the secondary components of the m complex envelopes, for the given scalar product. Moreover, the scalar product of any one of the primary components of the m complex envelopes and itself is nonzero, so that the orthogonality requirements entail that the m complex envelopes are linearly independent.

Let us for instance consider the case in which the excitations are such that, for any integer a greater than or equal to 1 and less than or equal to m, the excitation number a consists of a current $i_a(t)$, of complex envelope $i_{E\,a}(t)$, applied to the user port number a, the complex envelope $i_{E\,a}(t)$ being of the form $$i_{E\,a}(t) = i_{C\,a}(t) + i_{D\,a}(t) \quad (18)$$

where $i_{C\,a}(t)$ is the primary component of the complex envelope, and $i_{D\,a}(t)$ is the secondary component of the complex envelope, the primary components $i_{C\,1}(t), \ldots, i_{C\,m}(t)$ of the m complex envelopes being orthogonal to each other, and each of the primary components $i_{C\,1}(t), \ldots, i_{C\,m}(t)$ of the m complex envelopes being orthogonal to each of the secondary components $i_{D\,1}(t), \ldots, i_{D\,m}(t)$ of the m complex envelopes. In this case, the equation (13) is applicable, and the entries of $U_{TP}$ and of $J_{TP}$ can be easily computed, since, for any integer a greater than or equal to 1 and less than or equal to m, and for any integer b greater than or equal to 1 and less than or equal to n, the entry of the row b and the column a of $J_{TP}$, that is to say the b-th entry of the vector $j_{TP\,a}$, that is to say the a-th coordinate of the complex envelope $i_{TP\,b}(t)$ in the basis $i_{E\,1}(t), \ldots, i_{E\,m}(t)$, is clearly given by $$j_{ba} = \frac{\langle i_{C_a} | i_{TPb} \rangle}{\langle i_{C_a} | i_{C_a} \rangle} \quad (19)$$

and the entry of the row b and the column a of $U_{TP}$, that is to say the b-th entry of the vector $u_{TP\,a}$, that is to say the a-th coordinate of the complex envelope $v_{TP\,b}(t)$ in said basis, is clearly given by $$u_{ba} = \frac{\langle i_{C_a} | v_{TPb} \rangle}{\langle i_{C_a} | i_{C_a} \rangle} \quad (20)$$

For instance, let us assume that, for any integer b greater than or equal to 1 and less than or equal to n, the sensing unit number b delivers: a first sensing unit output signal proportional to the voltage across the target port number b; and a second sensing unit output signal proportional to the current flowing out of this target port. The signal processing unit may for instance perform a down-conversion of all sensing unit output signals, followed by a conversion into digital signals using bandpass sampling, and by a digital quadrature demodulation, to obtain, for any integer b greater than or equal to 1 and less than or equal to n, four digital signals: the samples of the real part of $V_{TP\,b}(t)$; the samples of the imaginary part of $V_{TP\,b}(t)$; the samples of the real part of $i_{TP\,b}(t)$; and the samples of the imaginary part of $i_{TP\,b}$. These digital signals may then be further processed, based on equations (19) and (20), to estimate all entries of $U_{TP}$ and of $J_{TP}$.

We have just considered, as an example, the case in which the excitations are such that, for any integer a greater than or equal to 1 and less than or equal to m, the excitation number a consists of a current $i_a(t)$, of complex envelope $i_{E\,a}(t)$, applied to the user port number a, the complex envelope $i_{E\,a}(t)$ being the sum of $i_{C\,a}(t)$ and $i_{D\,a}(t)$, where $i_{C\,a}(t)$ is the primary component of the complex envelope, and $i_{D\,a}(t)$ is the secondary component of the complex envelope, the primary components $i_{C\,1}(t), \ldots, i_{C\,m}(t)$ of the m complex envelopes being orthogonal to each other, each of the primary components $i_{C\,1}(t), \ldots, i_{C\,m}(t)$ of the m complex envelopes being orthogonal to each of the secondary components $i_{D\,1}(t), \ldots, i_{D\,m}(t)$ of the m complex envelopes. We have shown that, in this case, the effects of the different excitations can be easily identified, as if the different excitations had been applied successively to the user ports, so that the m excitations can be used to estimate the impedance matrix seen by the target ports, and any real quantity depending on the impedance matrix seen by the target ports. Alternatively, the excitations could for instance be such that, for any integer a greater than or equal to 1 and less than or equal to m, the excitation number a consists of a voltage $v_a(t)$, of complex envelope $v_{E\,a}(t)$, applied to the user port number a, the complex envelope $v_{E\,a}(t)$ being the sum of $v_{C\,a}(t)$ and $v_{D\,a}(t)$, where $v_{C\,a}(t)$ is the primary component of the complex envelope, and $v_{D\,a}(t)$ is the secondary component of the complex envelope, the primary components $v_{C\,1}(t), \ldots, v_{C\,m}(t)$ of the m complex envelopes being orthogonal to each other, each of the primary components $v_{C\,1}(t), \ldots, v_{C\,m}(t)$ of the m complex envelopes being orthogonal to each of the secondary components $v_{D\,1}(t), \ldots, v_{D\,m}(t)$ of the m complex envelopes. In this case, using a proof similar to the one presented above for applied currents, we can show that the effects of the different excitations can be easily identified, as if the different excitations had been applied successively to the user ports, so that the m excitations can be used to estimate the impedance matrix seen by the target ports, and any real quantity depending on the impedance matrix seen by the target ports.

We observe that the type of excitations used in the fourth embodiment is a special case of the more general type of excitations used in this fifth embodiment, since excitations used in this fifth embodiment and having zero secondary components can be used in the fourth embodiment.

The specialist understands how to generate m excitations having complex envelopes, each of said complex envelopes being the sum of a first complex signal and a second complex signal, the first complex signal being referred to as the primary component of the complex envelope, the second complex signal being referred to as the secondary component of the complex envelope, the primary components of the m complex envelopes being orthogonal to each other, each of the primary components of the m complex envelopes being orthogonal to each of the secondary components of the m complex envelopes. For instance, let us consider m arbitrary sequences of data symbols, each sequence being modulated on a single sub-carrier of an OFDM signal, different sequences being modulated on different sub-carriers. The sub-carriers modulated by the m arbitrary sequences are orthogonal to one another, and each of them is orthogonal to any combination of sub-carriers which are not modulated by any one of the m arbitrary sequences, and which may carry any data. Thus, each of the sub-carriers modulated by the m arbitrary sequences could be used as the primary component of the complex envelope of one of the m excitations, and any combination of sub-carriers which are not modulated by any one of the m arbitrary sequences, and which may carry any data, could be used as the secondary component of the complex envelope of any one of them excitations. For instance, let us consider m different resource elements of an OFDM signal. The m different resource elements are orthogonal to one another, and each of the m different resource elements is orthogonal to any combination of resource elements which are not one of said m different resource elements. Thus, each of said m different resource elements could be used to obtain the primary component of the complex envelope of one of the m excitations, and any combination of resource elements which are not one of said m different resource elements could be used to obtain the secondary component of the complex envelope of any one of the m excitations.

We observe that, in typical standards applicable to MIMO wireless networks, OFDM or single carrier frequency domain equalization (SC-FDE) is used for transmission, and different resource elements in different spatial layers (also referred to as "spatial streams") are used to provide reference signals (also referred to as "pilots") for MIMO channel estimation. Such a reference signal, considered in a given spatial layer, can be used as the primary component of the complex envelope of one of the m excitations, and any combination of resource elements which are not used by such a reference signal, considered in a given spatial layer and carrying any data symbols, can be used to obtain the secondary component of the complex envelope of any one of the m excitations. This is because the reference signals meet suitable orthogonality relations. Consequently, this fifth embodiment is compatible with the requirements of standards typically applicable to MIMO wireless networks.

Sixth Embodiment

The sixth embodiment of a device of the invention, given by way of non-limiting example, also corresponds to the automatic tuning system having m=4 user ports and n=4 target ports shown in FIG. 1, and all explanations provided for the first embodiment are applicable to this sixth embodiment. Additionally, we have represented in FIG. 2 the multiple-input-port and multiple-output-port tuning unit (3) used in this sixth embodiment. This multiple-input-port and multiple-output-port tuning unit comprises:

n=4 output ports (311) (321) (331) (341);
  m=4 input ports (312) (322) (332) (342);
  n adjustable impedance devices of the tuning unit (301) each presenting a negative reactance and each being coupled in parallel with one of the output ports;
  n (n−1)/2 adjustable impedance devices of the tuning unit (302) each presenting a negative reactance and each having a first terminal coupled to one of the output ports and a second terminal coupled to one of the output ports which is different from the output port to which the first terminal is coupled;
  n=m windings (303) each having a first terminal coupled to one of the output ports and a second terminal coupled to one of the input ports;
  m adjustable impedance devices of the tuning unit (304) each presenting a negative reactance and each being coupled in parallel with one of the input ports;
  m (m−1)/2 adjustable impedance devices of the tuning unit (305) each presenting a negative reactance and each having a first terminal coupled to one of the input ports and a second terminal coupled to one of the input ports which is different from the input port to which the first terminal is coupled.

Figure 2:
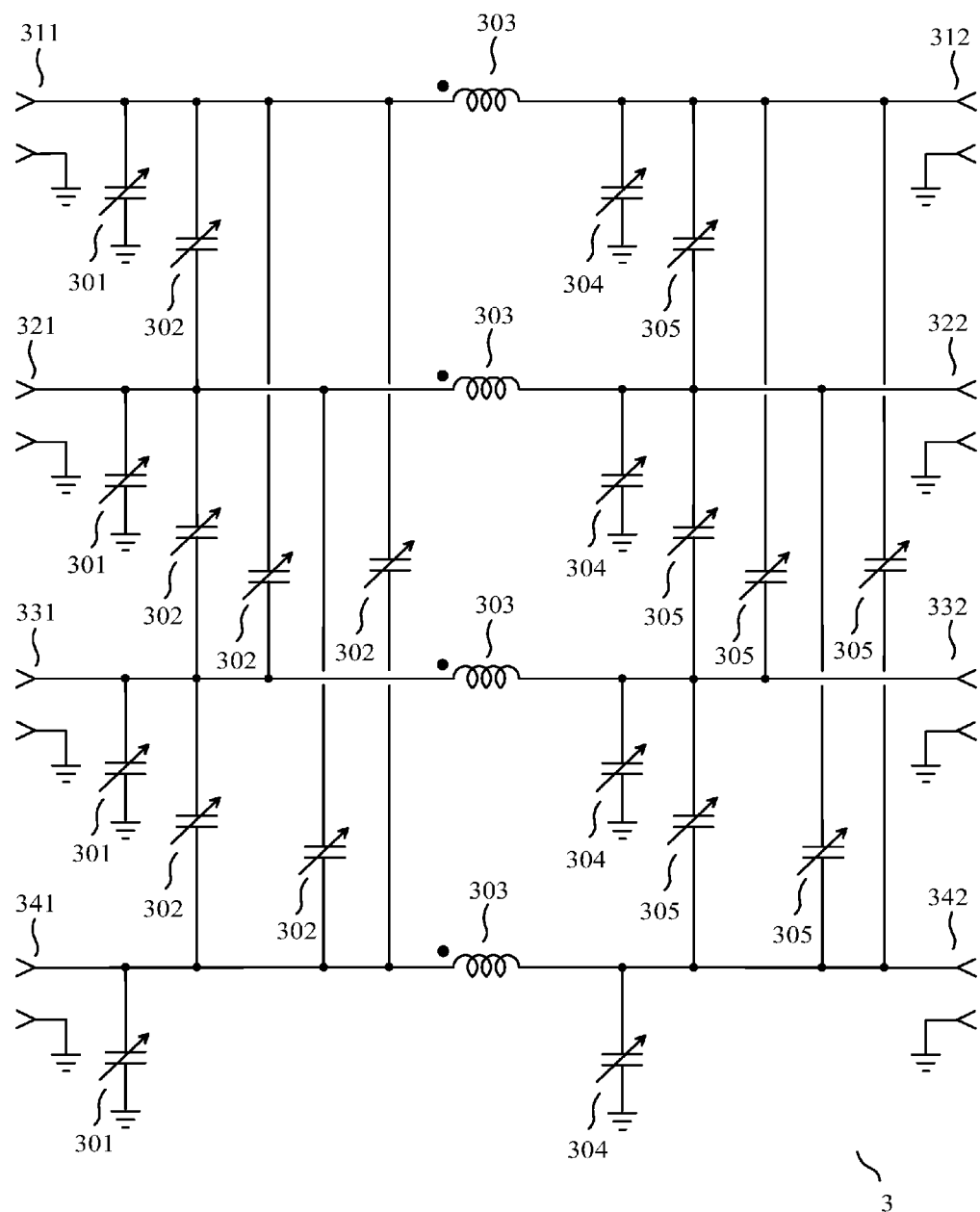
FIG. 2 shows a schematic diagram of a multiple-input-port and multiple-output-port tuning unit having 4 input ports and 4 output ports, which may be used in the automatic tuning system shown in FIG. 1 (sixth embodiment)

As shown in FIG. 1 and FIG. 2, each of the output ports (311) (321) (331) (341) is indirectly coupled to one and only one of the target ports (911) (921) (931) (941) through one of the sensing units (9), and each of the input ports (312) (322) (332) (342) is directly coupled to one and only one of the user ports (712) (722) (732) (742). Thus, at said given frequency, the impedance matrix presented by the input ports is equal to the impedance matrix presented by the user ports. The sensing units are such that, at said given frequency, the impedance matrix seen by the output ports is close to the impedance matrix seen by the target ports.

It is possible that mutual induction exists between the windings (303). In this case, the inductance matrix of the windings is not a diagonal matrix.

All adjustable impedance devices of the tuning unit (301) (302) (304) (305) are adjustable by electrical means, but the circuits and the control links needed to determine the reactance of each of the adjustable impedance devices of the tuning unit are not shown in FIG. 2. In this sixth embodiment, we have n=m and we use p=m (m+1)=20 adjustable impedance devices of the tuning unit.

The specialist knows that the characteristics of the tuning unit shown in FIG. 2 have been investigated in: the article of F. Broyde and E. Clavelier, entitled "A New Multiple-Antenna-Port and Multiple-User-Port Antenna Tuner", published in Proc. 2015 *IEEE Radio & Wireless Week*, RWW 2015, at the pages 41 to 43, in January 2015; said article entitled "Some Properties of Multiple-Antenna-Port and Multiple-User-Port Antenna Tuners"; and the article of F. Broyde and E. Clavelier entitled "Two Multiple-Antenna-Port and Multiple-User-Port Antenna Tuners", published in *Proc. 9th European Conference on Antenna and Propagation, EuCAP* 2015, in April 2015.

The specialist understands that, at a frequency at which the multiple-input-port and multiple-output-port tuning unit is intended to operate, if the impedance matrix seen by the target ports is a diagonal matrix having all its diagonal entries equal to 50Ω, the reactance of any one of the adjustable impedance devices of the tuning unit has an influence on the impedance matrix presented by the user ports, and the reactance of one or more of the adjustable impedance devices of the tuning unit has an influence on one or more of the non-diagonal entries of the impedance matrix presented by the user ports.

The impedance matrix seen by the target ports being a given symmetric complex matrix, it is possible to show that, for suitable component values, the p partial derivatives defined above are linearly independent in the real vector space of the complex matrices of size m by m, this vector space being of dimension $2m^2$. In this vector space, the span of the p partial derivatives is a subspace of dimension p equal to the set of the symmetric complex matrices of size m by m. Here, any symmetric complex matrix of size m by m is an element of the span of the p partial derivatives. Consequently, any diagonal complex matrix of size m by m has the same diagonal entries as at least one element of the span of the p partial derivatives.

The reactance of an adjustable impedance device may depend on the ambient temperature, for some types of adjustable impedance devices. If such a type of adjustable impedance device is used in the multiple-input-port and multiple-output-port tuning unit, it is possible that the tuning control signals are determined as a function of the tuning instruction and as a function of one or more temperatures, to compensate the effect of temperature on the reactance of each of the adjustable impedance devices of the tuning unit. If such a type of adjustable impedance device is used in the multiple-input-port and multiple-output-port tuning unit, it is also possible that one or more temperatures are taken into account to obtain the tuning instruction, to compensate the effect of temperature on the reactance of each of the adjustable impedance devices of the tuning unit. In this case, the signal processing unit delivers a tuning instruction as a function of said q real quantities depending on an impedance matrix seen by the target ports, and as a function of said one or more temperatures. For instance, the signal processing unit could use a lookup table to determine the tuning instruction, based on the q real quantities depending on an impedance matrix seen by the target ports, the frequency of operation, and said one or more temperatures. The specialist understands that, since, as explained above, the method of the invention uses an open-loop control scheme, the compensation of temperature variations may be more important than in prior art methods which use a closed-loop control scheme.

The specialist understands that, if the impedance matrix seen by the target ports is symmetric, any small variation in the impedance matrix seen by the target ports can be compensated with a new adjustment of the adjustable impedance devices of the tuning unit. Thus, it is always possible to obtain that $Z_U$ approximates a symmetric wanted matrix.

In this sixth embodiment, an adaptive process is implemented by the signal processing unit, during one or more tuning sequences. A first possible adaptive process is the following: during each of said tuning sequences, the signal processing unit estimates the real part and the imaginary part of the $n^2$ entries of $Z_{Sant}$, which are $q=2n^2$ real quantities depending on an impedance matrix seen by the target ports; the signal processing unit computes the real part and the imaginary part of the $n^2$ entries of the admittance matrix seen by the target ports, which is equal to $Z_{Sant}^{-1}$; and the signal processing unit determines a tuning instruction, using said entries of the admittance matrix seen by the target ports. A second possible adaptive process is the following: during each of said tuning sequences, the signal processing unit estimates the real part and the imaginary part of the $n^2$ entries of the admittance matrix seen by the target ports, which are $q=2n^2$ real quantities depending on an impedance matrix seen by the target ports; and the signal processing unit determines a tuning instruction, using said entries of the admittance matrix seen by the target ports. A third possible adaptive process is the following: during each of said tuning sequences, the signal processing unit estimates the real part and the imaginary part of the $n^2$ entries of the scattering matrix seen by the target ports, which are $q=2n^2$ real quantities depending on an impedance matrix seen by the target ports; the signal processing unit computes the real part and the imaginary part of the $n^2$ entries of the admittance matrix seen by the target ports; and the signal processing unit determines a tuning instruction, using said entries of the admittance matrix seen by the target ports.

The specialist understands that, in many possible applications, the impedance matrix seen by the target ports is a symmetric matrix, so that the admittance matrix seen by the target ports and the scattering matrix seen by the target ports are symmetric matrices which are each fully defined by n (n+1) real quantities. Thus, only n (n+1) real quantities depending on an impedance matrix seen by the target ports are needed to fully define the impedance matrix seen by the target ports, the admittance matrix seen by the target ports, and the scattering matrix seen by the target ports. The specialist understands how the three possible adaptive processes defined above can use this property and/or be modified to take advantage of this property.

The specialist understands that the third possible adaptive process is very simple in the case where each of the sensing units is such that the two sensing unit output signals delivered by said each of the sensing units comprise: a first sensing unit output signal proportional to an incident voltage at one of the target ports; and a second sensing unit output signal proportional to a reflected voltage at said one of the target ports.

Seventh Embodiment

The seventh embodiment of a device of the invention, given by way of non-limiting example, also corresponds to the automatic tuning system having m=4 user ports and n=4 target ports shown in FIG. 1, and all explanations provided for the first embodiment are applicable to this seventh embodiment. Additionally, we have represented in FIG. 3 the multiple-input-port and multiple-output-port tuning unit (3) used in this seventh embodiment. This multiple-input-port and multiple-output-port tuning unit comprises:

n=4 output ports (311) (321) (331) (341);
m=4 input ports (312) (322) (332) (342);
n adjustable impedance devices of the tuning unit (301) each presenting a negative reactance and each being coupled in parallel with one of the output ports;
n (n−1)/2 capacitors (306) each having a first terminal coupled to one of the output ports and a second terminal coupled to one of the output ports which is different from the output port to which the first terminal is coupled;

n=m windings (303) each having a first terminal coupled to one of the output ports and a second terminal coupled to one of the input ports;

m adjustable impedance devices of the tuning unit (304) each presenting a negative reactance and each being coupled in parallel with one of the input ports;

m (m−1)/2 capacitors (307) each having a first terminal coupled to one of the input ports and a second terminal coupled to one of the input ports which is different from the input port to which the first terminal is coupled.

Figure 3:
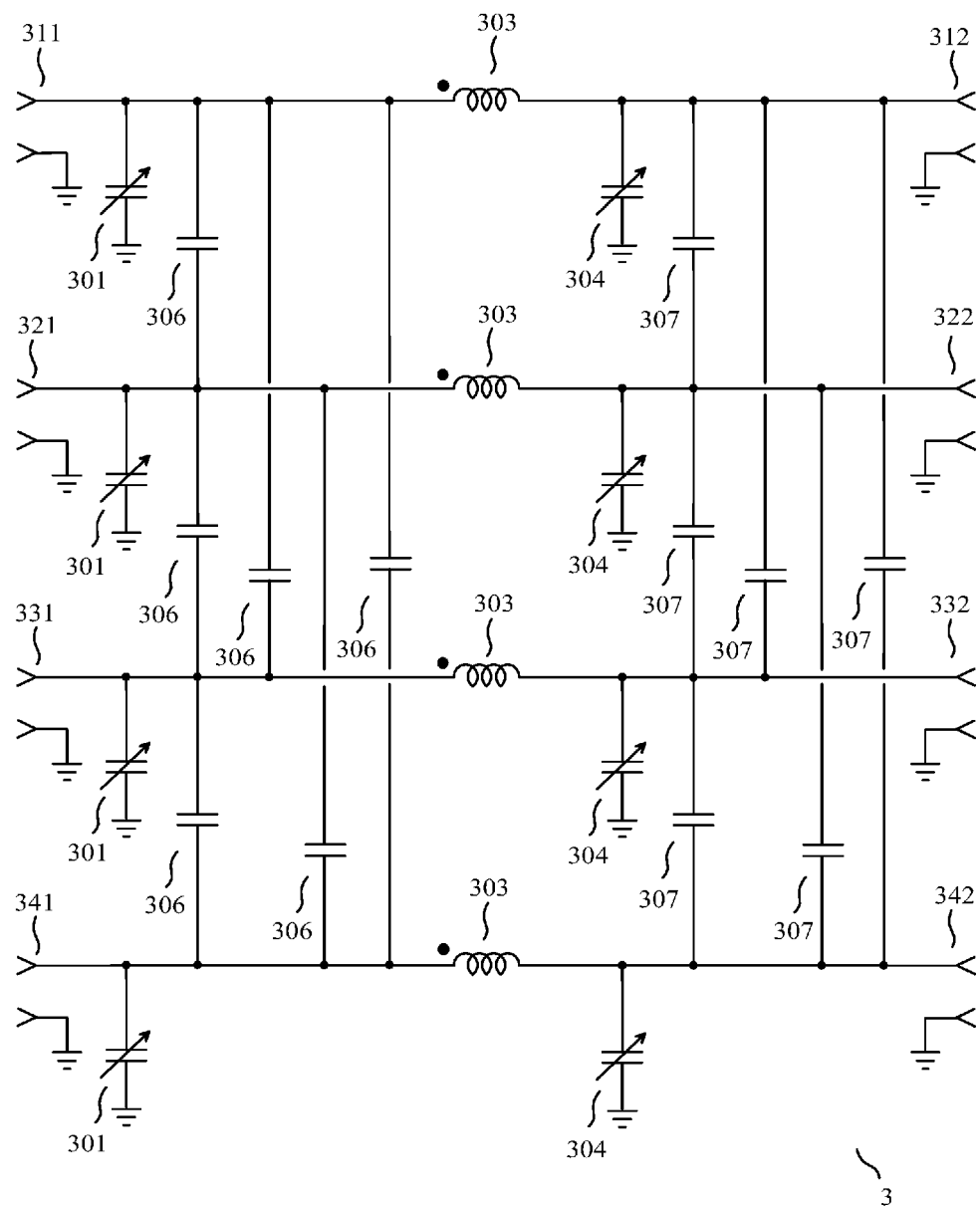
FIG. 3 shows a schematic diagram of a multiple-input-port and multiple-output-port tuning unit having 4 input ports and 4 output ports, which may be used in the automatic tuning system shown in FIG. 1 (seventh embodiment)

As shown in FIG. 1 and FIG. 3, each of the output ports (311) (321) (331) (341) is indirectly coupled to one and only one of the target ports (911) (921) (931) (941) through one of the sensing units (9), and each of the input ports (312) (322) (332) (342) is directly coupled to one and only one of the user ports (712) (722) (732) (742). Thus, at said given frequency, the impedance matrix presented by the input ports is equal to the impedance matrix presented by the user ports. The sensing units are such that, at said given frequency, the impedance matrix seen by the output ports is close to the impedance matrix seen by the target ports.

It is possible that mutual induction exists between the windings (303). In this case, the inductance matrix of the windings is not a diagonal matrix. All adjustable impedance devices of the tuning unit (301) (304) are adjustable by electrical means, but the circuits and the control links needed to determine the reactance of each of the adjustable impedance devices of the tuning unit are not shown in FIG. 3.

The specialist understands that, at a frequency at which the multiple-input-port and multiple-output-port tuning unit is intended to operate, if the impedance matrix seen by the target ports is a diagonal matrix having all its diagonal entries equal to 50Ω, the reactance of any one of the adjustable impedance devices of the tuning unit has an influence on $Z_U$, and the reactance of one or more of the adjustable impedance devices of the tuning unit has an influence on one or more of the non-diagonal entries of $Z_U$. For suitable component values, it is possible to show that the p=8 partial derivatives defined above are linearly independent in the real vector space of dimension 32 of the complex matrices of size 4 by 4. In this vector space, the span of the p partial derivatives is of dimension 8. It is also possible to show that any diagonal complex matrix of size m by m has the same diagonal entries as at least one element of the span of the p partial derivatives.

The specialist understands that any small variation in the impedance matrix seen by the target ports can be partially compensated with a new adjustment of the adjustable impedance devices of the tuning unit, the compensation being automatic and usually better in the case where the impedance matrix seen by the target ports and the wanted impedance matrix are symmetric matrices. Thus, it is always possible to automatically and approximately tune the impedance matrix presented by the user ports.

If the capacitors (306) (307) have a value equal to 0 pF (or are not present in the circuit shown in FIG. 3), and if mutual induction does not exist between the windings (303), we see that the multiple-input-port and multiple-output-port tuning unit (3) is in fact composed of 4 single-input-port and single-output-port tuning units, these single-input-port and single-output-port tuning units being independent and uncoupled. More generally, an automatic tuning system having said m user ports and n target ports may, in the case n=m, be such that its multiple-input-port and multiple-output-port tuning unit is composed of n single-input-port and single-output-port tuning units, each comprising one or more of said adjustable impedance devices of the tuning unit, or two or more of said adjustable impedance devices of the tuning unit, these single-input-port and single-output-port tuning units being independent and uncoupled.

In this case, the method of the invention may become a method for automatically adjusting n single-input-port and single-output-port tuning units, where n is an integer greater than or equal to 2, each of the single-input-port and single-output-port tuning units being a part of an automatic tuning system having n "user ports" and n "target ports", the automatic tuning system allowing, at a given frequency, a transfer of power from the user ports to the target ports, each of said single-input-port and single-output-port tuning units comprising one or more (or two or more) adjustable impedance devices, each of the adjustable impedance devices of said each of said single-input-port and single-output-port tuning units having a reactance at said given frequency, the reactance of any one of the adjustable impedance devices having an influence on the impedance matrix presented by the user ports, the reactance of any one of the adjustable impedance devices being adjustable by electrical means, the method comprising the steps of:

applying n excitations to the user ports, one and only one of the excitations being applied to each of the user ports;

estimating q real quantities depending on an impedance matrix seen by the target ports, where q is an integer greater than or equal to n, using said n excitations;

using said q real quantities depending on an impedance matrix seen by the target ports, to obtain "tuning control signals"; and applying each of the tuning control signals to one or more of the adjustable impedance devices of the tuning unit, the reactance of each of the adjustable impedance devices of the tuning unit being mainly determined by one or more of the tuning control signals.

An apparatus implementing this method is an automatic tuning system having n "user ports" and n "target ports", where n is an integer greater than or equal to 2, the automatic tuning system allowing, at a given frequency, a transfer of power from the user ports to the target ports, the automatic tuning system comprising:

at least n sensing units, each of the sensing units delivering one or more "sensing unit output signals", each of the sensing unit output signals being mainly determined by one or more electrical variables;

a signal processing unit, the signal processing unit estimating q real quantities depending on an impedance matrix seen by the target ports, where q is an integer greater than or equal to n, using the sensing unit output signals obtained for n excitations applied to the user ports, one and only one of the excitations being applied to each of the user ports, the signal processing unit delivering a "tuning instruction" as a function of said q real quantities depending on an impedance matrix seen by the target ports;

n single-input-port and single-output-port tuning units, each of said single-input-port and single-output-port tuning units comprising one or more (or two or more) adjustable impedance devices, each of the adjustable impedance devices of said each of said single-input-port and single-output-port tuning units having a reactance at said given frequency, the reactance of any one of the adjustable impedance devices having an influence on the impedance matrix presented by the user ports, the reactance of any one of the adjustable impedance devices being adjustable by electrical means; and a tuning control unit, the tuning control unit receiving the tuning instruction from the signal processing unit, the tuning control unit delivering "tuning control signals" to the single-input-port and single-output-port tuning units, the tuning control signals being determined as a function of the tuning instruction, the reactance of each of the adjustable impedance devices being mainly determined by one or more of the tuning control signals.

Eighth Embodiment

Figure 4:
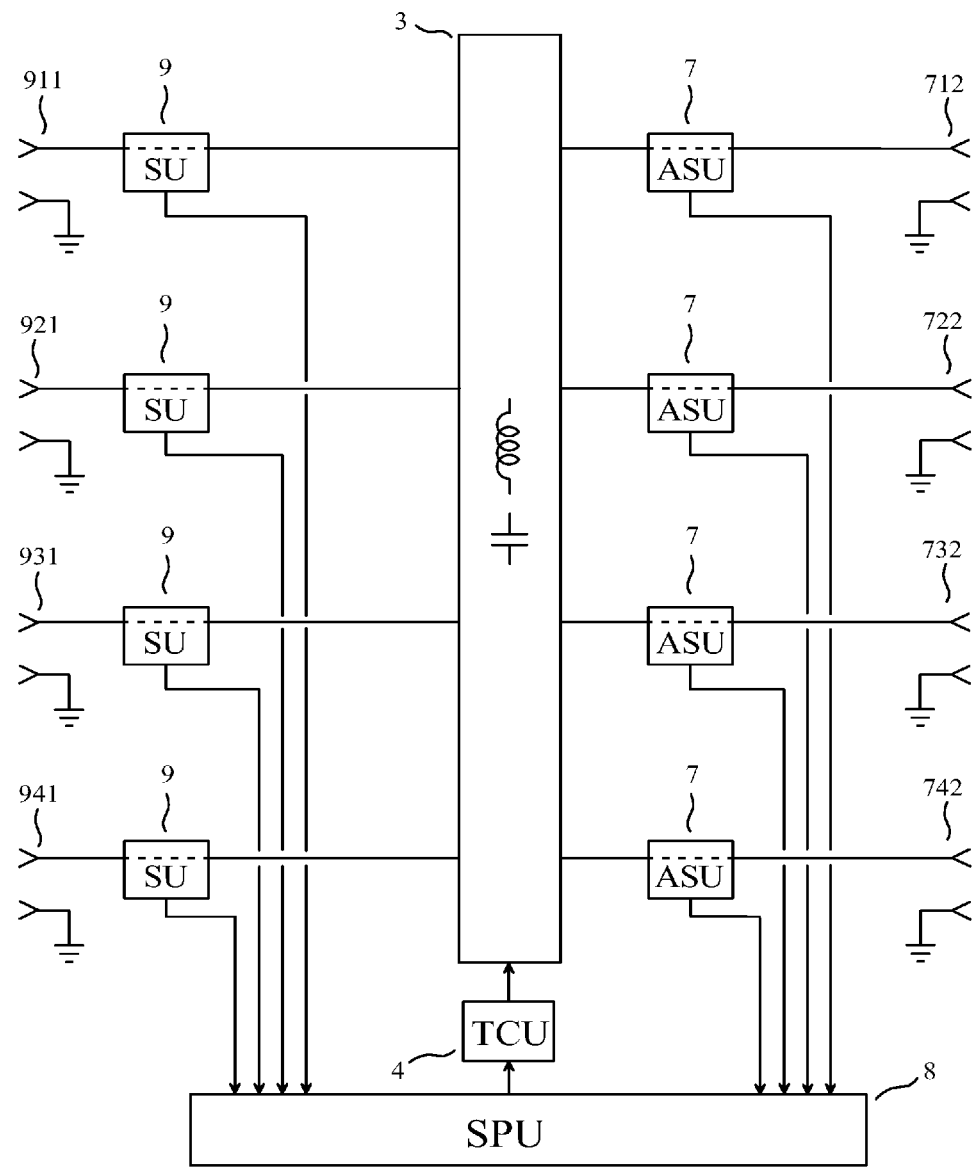
FIG. 4 shows the block diagram of an automatic tuning system having 4 user ports and 4 target ports (eighth embodiment)

As an eighth embodiment of a device of the invention, given by way of non-limiting example, we have represented in FIG. 4 the block diagram of an automatic tuning system having m=4 user ports (712) (722) (732) (742) and n=4 target ports (911) (921) (931) (941), the automatic tuning system allowing, at a given frequency greater than or equal to 300 MHz, a transfer of power from the user ports to the target ports, the automatic tuning system comprising:
- n sensing units (9), each of the sensing units delivering two "sensing unit output signals", each of the sensing unit output signals being determined by one electrical variable;
- m additional sensing units (7), each of the additional sensing units delivering one or more "additional sensing unit output signals", each of the additional sensing unit output signals being determined by one electrical variable;
- a signal processing unit (8), the signal processing unit estimating q real quantities depending on an impedance matrix seen by the target ports, where q is an integer greater than or equal to m, using the sensing unit output signals obtained for m excitations applied to the user ports, one and only one of the excitations being applied to each of the user ports, the signal processing unit delivering a "tuning instruction" as a function of said q real quantities depending on an impedance matrix seen by the target ports, using the additional sensing unit output signals;
- a multiple-input-port and multiple-output-port tuning unit (3), the multiple-input-port and multiple-output-port tuning unit comprising p adjustable impedance devices, where p is an integer greater than or equal to 2m=8, the p adjustable impedance devices being referred to as "the adjustable impedance devices of the tuning unit" and being such that, at said given frequency, each of the adjustable impedance devices of the tuning unit has a reactance, the reactance of any one of the adjustable impedance devices of the tuning unit being adjustable by electrical means; and
- a tuning control unit (4), the tuning control unit receiving the tuning instruction from the signal processing unit (8), the tuning control unit delivering "tuning control signals" to the multiple-input-port and multiple-output-port tuning unit (3), the tuning control signals being determined as a function of the tuning instruction, the reactance of each of the adjustable impedance devices of the tuning unit being mainly determined by one or more of the tuning control signals.

As in the first embodiment, each of the sensing units (9) may for instance be such that the two sensing unit output signals delivered by said each of the sensing units comprise: a first sensing unit output signal proportional to a first electrical variable, the first electrical variable being a voltage across one of the target ports; and a second sensing unit output signal proportional to a second electrical variable, the second electrical variable being a current flowing out of said one of the target ports. Said voltage across one of the target ports may be a complex voltage and said current flowing out of said one of the target ports may be a complex current. Alternatively, each of the sensing units (9) may for instance be such that the two sensing unit output signals delivered by said each of the sensing units comprise: a first sensing unit output signal proportional to a first electrical variable, the first electrical variable being an incident voltage at one of the target ports; and a second sensing unit output signal proportional to a second electrical variable, the second electrical variable being a reflected voltage at said one of the target ports. Said incident voltage at one of the target ports may be a complex incident voltage and said reflected voltage at said one of the target ports may be a complex reflected voltage.

Each of the additional sensing units (7) may for instance be such that the two additional sensing unit output signals delivered by said each of the additional sensing units comprise: a first additional sensing unit output signal proportional to a first electrical variable, the first electrical variable being a voltage across one of the user ports; and a second additional sensing unit output signal proportional to a second electrical variable, the second electrical variable being a current flowing in said one of the user ports. Said voltage across one of the user ports may be a complex voltage and said current flowing in said one of the user ports may be a complex current. Alternatively, each of the additional sensing units (7) may for instance be such that the two additional sensing unit output signals delivered by said each of the additional sensing units comprise: a first additional sensing unit output signal proportional to a first electrical variable, the first electrical variable being an incident voltage at one of the user ports; and a second additional sensing unit output signal proportional to a second electrical variable, the second electrical variable being a reflected voltage at said one of the user ports. Said incident voltage at one of the user ports may be a complex incident voltage and said reflected voltage at said one of the user ports may be a complex reflected voltage.

Ninth Embodiment

Figure 5:
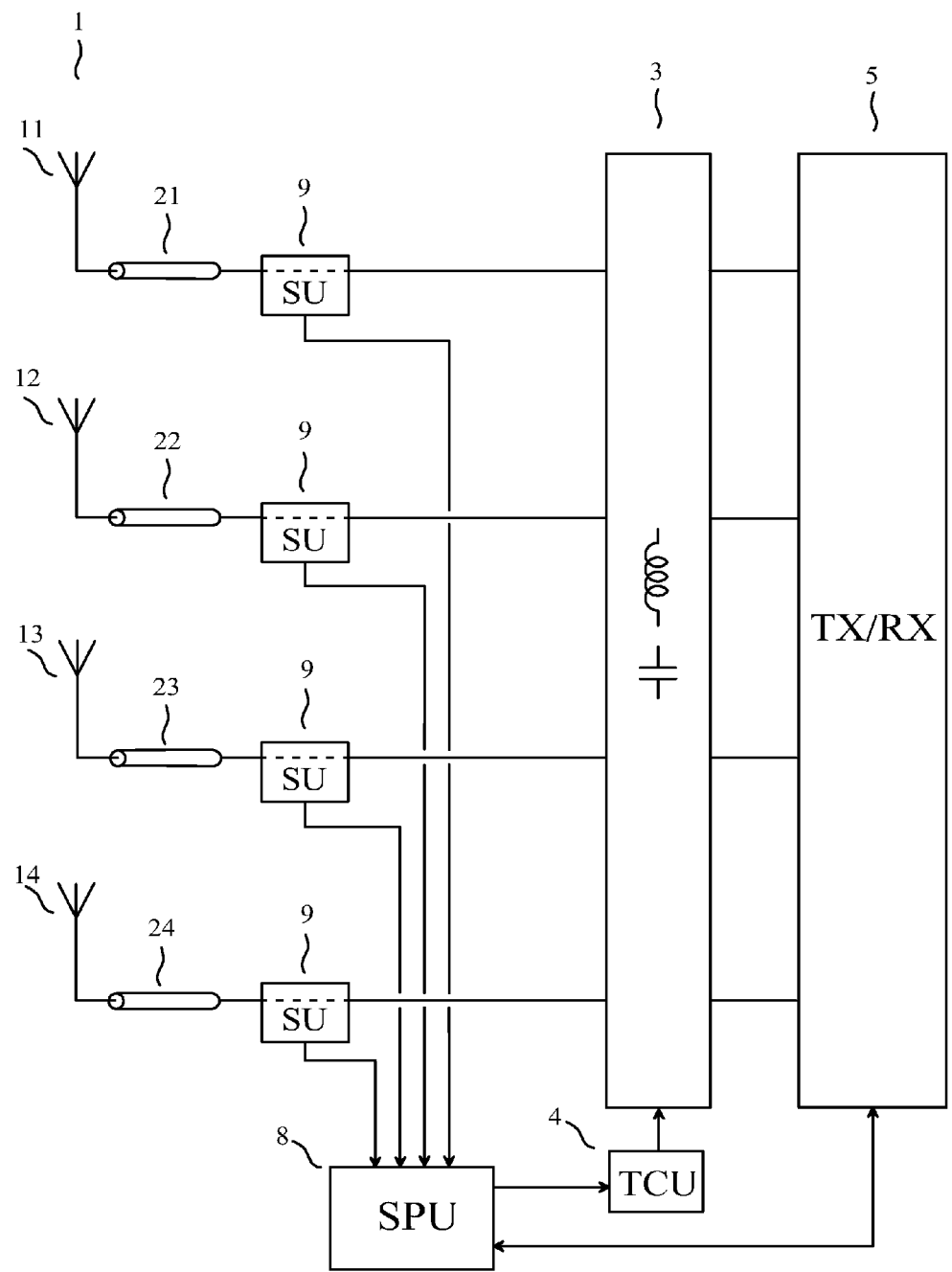
FIG. 5 shows the block diagram of a transceiver for radio communication using several antennas and comprising an automatic tuning system (ninth embodiment)

As a ninth embodiment of a device of the invention, given by way of non-limiting example, we have represented in FIG. 5 the block diagram of a transceiver for radio communication using an automatic tuning system of the invention. The transceiver shown in FIG. 5 is a transceiver for radio communication with multiple antennas in a given frequency band, comprising:
- n=4 antennas (11) (12) (13) (14), the n antennas operating simultaneously in the given frequency band, the n antennas forming an antenna array (1);
- n=4 feeders (21) (22) (23) (24), each of the feeders having a far end and a near end, each of the antennas being coupled to the far end of one and only one of the feeders, the near ends of the feeders presenting, at a frequency in the given frequency band, an impedance matrix referred to as "the impedance matrix presented by the near ends of the feeders";
- a radio device (5) which consists of all parts of the transceiver which are not shown elsewhere in FIG. 5, the radio device having m=4 radio ports, the radio device delivering "tuning sequence instructions" which indicate when a tuning sequence is being performed, m excitations being delivered by the radio ports during said tuning sequence, one and only one of the excitations being delivered by each of the radio ports;

n sensing units (9), each of the sensing units delivering two "sensing unit output signals", each of the sensing unit output signals being determined by one electrical variable;

a multiple-input-port and multiple-output-port tuning unit (3), the multiple-input-port and multiple-output-port tuning unit comprising n=4 output ports, each of the output ports being indirectly coupled to the near end of one and only one of the feeders through one of the sensing units (9), the multiple-input-port and multiple-output-port tuning unit comprising m=4 input ports, each of the input ports being directly coupled to one of the radio ports of the radio device (5), the multiple-input-port and multiple-output-port tuning unit comprising p adjustable impedance devices, where p is an integer greater than or equal to 2m=8, the p adjustable impedance devices being referred to as "the adjustable impedance devices of the tuning unit" and being such that, at said frequency in the given frequency band, each of the adjustable impedance devices of the tuning unit has a reactance, the reactance of any one of the adjustable impedance devices of the tuning unit being adjustable by electrical means;

a signal processing unit (8), the signal processing unit estimating q real quantities depending on the impedance matrix presented by the near ends of the feeders, where q is an integer greater than or equal to m, using the tuning sequence instructions and using the sensing unit output signals obtained while the m excitations were delivered by the radio ports during a tuning sequence, the signal processing unit delivering a "tuning instruction" as a function of said q real quantities depending on the impedance matrix presented by the near ends of the feeders; and a tuning control unit (4), the tuning control unit receiving the tuning instruction from the signal processing unit (8), the tuning control unit delivering "tuning control signals" to the multiple-input-port and multiple-output-port tuning unit (3), the tuning control signals being determined as a function of the tuning instruction, the reactance of each of the adjustable impedance devices of the tuning unit being mainly determined by one or more of the tuning control signals.

The specialist understands that the "impedance matrix presented by the near ends of the feeders" of this ninth embodiment corresponds to the "impedance matrix seen by the target ports" of the first embodiment, evaluated at said frequency in the given frequency band.

The transceiver for radio communication is used for MIMO wireless transmission in a cellular network. The excitations have complex envelopes which comply with the characteristics presented in the fifth embodiment, so that these excitations are compatible with the requirements of standards typically applicable to MIMO wireless networks.

The specialist understands that any small variation in the impedance matrix of the multiport antenna array formed by the antennas, caused by a change in operating frequency or a change in the medium surrounding the antennas, for instance due to user interaction, can be compensated with an automatic adjustment of the adjustable impedance devices of the tuning unit. Thus, it is always possible to obtain the best performance from the transceiver for radio communication with multiple antennas.

The signal processing unit (8) also estimates one or more quantities each depending on the power delivered by the output ports, this power being substantially equal to the power received by the near ends of the feeders. Information on said quantities each depending on the power delivered by the output ports is sent to the radio device (5), in which it may be used for radiated power control when the transceiver transmits, in line with standards typically applicable to MIMO wireless networks. This information is suitable for an accurate radiated power control, because it takes into account the losses in the multiple-input-port and multiple-output-port tuning unit (3).

Consequently, this ninth embodiment provides a solution to the problem of automatically adjusting a multiple-input-port and multiple-output-port tuning unit which is a part of a radio transceiver used for MIMO wireless communication, in a manner that complies with standards typically applicable to MIMO wireless networks.

Tenth Embodiment

The tenth embodiment of a device of the invention, given by way of non-limiting example, also corresponds to the transceiver for radio communication shown in FIG. 5, and all explanations provided for the ninth embodiment are applicable to this tenth embodiment. Additionally, in this tenth embodiment, the signal processing unit (8) delivers the "tuning instruction" as a function of said q real quantities depending on the impedance matrix presented by the near ends of the feeders, and as a function of one or more localization variables, each of the localization variables depending on the distance between a part of a human body and a zone of the transceiver for radio communication.

It is said above that each of the localization variables depends on the distance between a part of a human body and a zone of the transceiver for radio communication. This must be interpreted as meaning: each of the localization variables is such that there exists at least one configuration in which the distance between a part of a human body and a zone of the transceiver for radio communication has an effect on said each of the localization variables.

For instance, a "localization sensor unit" may estimate one or more localization variables each depending, in a given use configuration, on the distance between a part of a human body and a zone of the transceiver for radio communication. The localization sensor unit may comprise a plurality of localization sensors. Each of said zones may be a part of the space occupied by the corresponding localization sensor, this space being inside the space occupied by the transceiver for radio communication, so that in this case each of said zones has a volume much less than the volume of the transceiver for radio communication. For each of the antennas, at least one of the localization variables may depend on the distance between a part of a human body and a small zone near said each of the antennas. If a suitable localization sensor is used, said zone may be a point, or substantially a point.

For instance, at least one of the localization variables may be an output of a localization sensor responsive to a pressure exerted by a part of a human body. For instance, at least one of the localization variables may be an output of a proximity sensor.

The localization sensor unit assesses (or equivalently, estimates) a plurality of localization variables each depending, in a given use configuration, on the distance between a part of a human body and a zone of the transceiver for radio communication. However, it is possible that one or more other localization variables each depending, in a given use configuration, on the distance between a part of a human body and a zone of the transceiver for radio communication, are not estimated by the localization sensor unit. For instance, at least one of the localization variables may be determined by a change of state of an output of a touch-screen. Thus, the localization sensor unit may be regarded as a part of a localization unit which estimates (or evaluates) a plurality of variables, each of said variables being referred to as "localization variable", each of the localization variables depending on the distance between a part of a human body and a zone of the transceiver for radio communication. This part of the localization unit may be the whole localization unit.

This tenth embodiment may possibly use some aspects of the technique disclosed in the French patent application No. 14/00606 of 13 Mar. 2014 entitled "Communication radio utilisant des antennes multiples et des variables de localisation", corresponding to the international application No. PCT/IB2015/051548 of 3 Mar. 2015 entitled "Radio communication using multiple antennas and localization variables".

Eleventh Embodiment

The eleventh embodiment of a device of the invention, given by way of non-limiting example, also corresponds to the transceiver for radio communication shown in FIG. 5, and all explanations provided for the ninth embodiment are applicable to this eleventh embodiment. Additionally, in this eleventh embodiment, at least one tunable passive antenna is among said n antennas, said at least one tunable passive antenna comprising at least one antenna control device, one or more characteristics of said at least one tunable passive antenna being controlled using said at least one antenna control device, said at least one antenna control device having at least one parameter having an influence on said one or more characteristics, said at least one parameter being adjustable by electrical means, each of said parameters being mainly determined by one or more "antenna control signals". In the previous sentence, "each of said parameters" clearly means "each said at least one parameter of each said at least one antenna control device of each said at least one tunable passive antenna".

Many different types of antenna control device may be used to control one or more characteristics of any one of the tunable passive antennas. A suitable antenna control device may for instance be:
  an electrically controlled switch or change-over switch, in which case a parameter of the antenna control device having an influence on one or more characteristics of the tunable passive antenna may be the state of the switch or change-over switch;
  an adjustable impedance device, in which case a parameter of the antenna control device having an influence on one or more characteristics of the tunable passive antenna may be the reactance or the impedance of the adjustable impedance device at a specified frequency; or
  an actuator arranged to produce a mechanical deformation of the tunable passive antenna, in which case a parameter of the antenna control device having an influence on one or more characteristics of the tunable passive antenna may be a length of the deformation.

If an antenna control device is an electrically controlled switch or change-over switch, it may for instance be an electro-mechanical relay, or a microelectromechanical switch (MEMS switch), or a circuit using one or more PIN diodes and/or one or more insulated-gate field-effect transistors (MOSFETs) as switching devices.

This eleventh embodiment may possibly use some aspects of the technique disclosed in the French patent application No. 14/00666 of 20 Mar. 2014, entitled "Communication radio utilisant des antennes accordables et un appareil d'accord d'antenne", corresponding to the international application No. PCT/B2015/051644 of 6 Mar. 2015 entitled "Radio communication using tunable antennas and an antenna tuning apparatus".

Twelfth Embodiment

Figure 6:
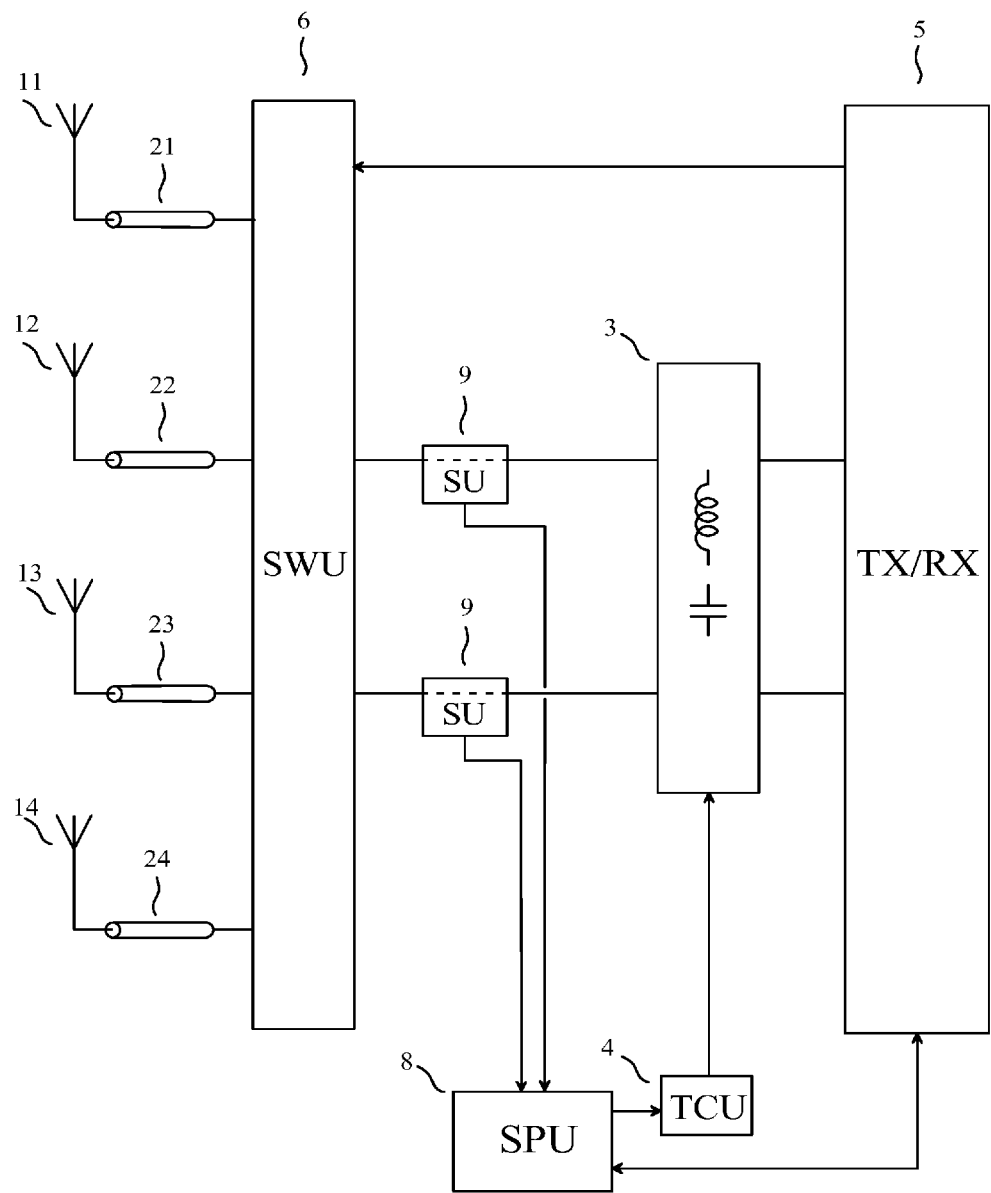
FIG. 6 shows the block diagram of a transceiver for radio communication using several antennas and comprising an automatic tuning system (twelfth embodiment).

As a twelfth embodiment of a device of the invention, given by way of non-limiting example, we have represented in FIG. 6 the block diagram of a transceiver for radio communication using an automatic tuning system of the invention. The transceiver shown in FIG. 6 is a transceiver for radio communication with multiple antennas in a given frequency band, comprising:
  N=4 antennas (11) (12) (13) (14), each of the N antennas being such that it can operate at any frequency in the given frequency band;
  a radio device (5) which consists of all parts of the transceiver which are not shown elsewhere in FIG. 6, the radio device having m=2 radio ports, the radio device delivering "tuning sequence instructions" which indicate when a tuning sequence is being performed, m excitations being delivered by the radio ports during said tuning sequence, one and only one of the excitations being delivered by each of the radio ports;
  a switching unit (6), the switching unit receiving a "configuration instruction" generated automatically by the radio device, the switching unit comprising N antenna ports each coupled to one and only one of the antennas through a feeder (21) (22) (23) (24), the switching unit comprising n=2 array ports, the switching unit operating in an active configuration determined by the configuration instruction, the active configuration being one of a plurality of allowed configurations, the switching unit providing, in any one of the allowed configurations, for signals in the given frequency band and for any one of the array ports, a bidirectional path between said any one of the array ports and one and only one of the antenna ports;
  n sensing units (9), each of the sensing units delivering two "sensing unit output signals", each of the sensing unit output signals being determined by one electrical variable;
  a multiple-input-port and multiple-output-port tuning unit (3), the multiple-input-port and multiple-output-port tuning unit comprising n=2 output ports, each of the output ports being indirectly coupled to one and only one of the array ports of the switching unit (6) through one of the sensing units (9), the multiple-input-port and multiple-output-port tuning unit comprising m=2 input ports, each of the input ports being directly coupled to one of the radio ports of the radio device (5), the multiple-input-port and multiple-output-port tuning unit comprising p adjustable impedance devices, where p is an integer greater than or equal to 2m=4, the p adjustable impedance devices being referred to as "the adjustable impedance devices of the tuning unit" and being such that, at a frequency in the given frequency band, each of the adjustable impedance devices of the tuning unit has a reactance, the reactance of any one of the adjustable impedance devices of the tuning unit being adjustable by electrical means;

a signal processing unit (8), the signal processing unit estimating q real quantities depending on an impedance matrix presented by the array ports, where q is an integer greater than or equal to m, using the tuning sequence instructions and using the sensing unit output signals obtained while the m excitations were delivered by the radio ports during a tuning sequence, the signal processing unit delivering a "tuning instruction" as a function of said q real quantities depending on an impedance matrix presented by the array ports; and a tuning control unit (4), the tuning control unit receiving the tuning instruction from the signal processing unit (8), the tuning control unit delivering "tuning control signals" to the multiple-input-port and multiple-output-port tuning unit (3), the tuning control signals being determined as a function of the tuning instruction, the reactance of each of the adjustable impedance devices of the tuning unit being mainly determined by one or more of the tuning control signals.

The specialist understands that the "impedance matrix presented by the array ports" of this twelfth embodiment corresponds to the "impedance matrix seen by the target ports" of the first embodiment.

The switching unit operates (or is used) in an active configuration determined by the configuration instruction, the active configuration being one of a plurality of allowed configurations, the switching unit providing, in any one of the allowed configurations, for signals in the given frequency band and for any one of the array ports, a path between said any one of the array ports and one of the antenna ports. Thus, the switching unit operates in an active configuration which is one of the allowed configurations, and each allowed configuration corresponds to a selection of n antenna ports among the N antenna ports. It is also possible to say that the switching unit operates in an active configuration corresponding to a selection of n antenna ports among the N antenna ports.

Each allowed configuration corresponds to a selection of n antenna ports among the N antenna ports, the switching unit providing, for signals in the given frequency band and for any one of the array ports, a path between said any one of the array ports and one of the selected antenna ports. This path may preferably be a low loss path for signals in the given frequency band. The specialist understands that a suitable switching unit may comprise one or more electrically controlled switches and/or change-over switches (here, "electrically controlled" means "controlled by electrical means"). In this case, one or more of said electrically controlled switches and/or change-over switches may for instance be an electro-mechanical relay, or a microelectromechanical switch (MEMS switch), or a circuit using one or more PIN diodes and/or one or more insulated-gate field-effect transistors (MOSFETs) as switching devices.

For instance, the configuration instruction and/or the tuning instruction may be determined as a function of:

said q real quantities depending on an impedance matrix presented by the array ports;

one or more localization variables defined as in the tenth embodiment;

the frequencies used for radio communication with the antennas;

one or more additional variables, each of the additional variables lying in a set of additional variables, the elements of the set of additional variables comprising: communication type variables which indicate whether a radio communication session is a voice communication session, a data communication session or another type of communication session; a speakerphone mode activation indicator; a speaker activation indicator; variables obtained using one or more accelerometers; user identity variables which depend on the identity of the current user; reception quality variables; and emission quality variables.

The elements of said set of additional variables may further comprise one or more variables which are different from the localization variables and which characterize the grip with which a user is holding the transceiver.

The configuration instruction and/or the tuning instruction may for instance be determined using a lookup table realized in the signal processing unit.

Any small variation in the impedance matrix of the multiport antenna array formed by the antennas, caused by a change in operating frequency or a change in the medium surrounding the antennas, for instance due to user interaction, can be compensated with an automatic adjustment of the adjustable impedance devices of the tuning unit. Thus, it is always possible to obtain the best performance from the transceiver for radio communication with multiple antennas.

This twelfth embodiment may possibly use some aspects of the technique disclosed in the French patent application No. 14/01221 of 28 May 2014, entitled "Communication radio utilisant une pluralité d'antennes sélectionnées", corresponding to the international application No. PCT/IB2015/052974 of 23 Apr. 2015, entitled "Radio communication using a plurality of selected antennas".

INDICATIONS ON INDUSTRIAL APPLICATIONS

The method of the invention is suitable for optimally and automatically adjusting a multiple-input-port and multiple-output-port tuning unit, and the automatic tuning system of the invention can optimally and automatically adjust its multiple-input-port and multiple-output-port tuning unit. The automatic tuning system of the invention may be a part of a radio receiver using a plurality of antennas simultaneously, or of a radio transmitter using a plurality of antennas simultaneously. In such applications, each target port of the automatic tuning system of the invention may be coupled to an antenna, and each user port of the automatic tuning system of the invention may be coupled to one of the radio-frequency signal input ports of the radio receiver using a plurality of antennas simultaneously, or to one of the radio-frequency signal output ports of the radio transmitter using a plurality of antennas simultaneously. Thus, the method and the automatic tuning system of the invention are suitable for MIMO radio communication.

The method and the automatic tuning system of the invention provide the best possible characteristics using very close antennas, hence presenting a strong interaction between the antennas. The invention is therefore particularly suitable for mobile radio transmitters and radio transceivers, for instance those used in portable radiotelephones or portable computers.

The method and the automatic tuning system of the invention provide the best possible characteristics using a very large number of antennas in a given volume, hence presenting a strong interaction between the antennas. The invention is therefore particularly suitable for high-performance radio transmitters and radio transceivers, for instance those used in the fixed stations of cellular radiotelephony networks.

The invention claimed is:

1. A method for adjusting a multiple-input-port and multiple-output-port tuning unit in an automatic tuning system allowing, at a predetermined frequency, a transfer of power from m user ports to n target ports, where m is an integer greater than or equal to 2 and where n is an integer greater than or equal to 2, the method comprising the steps of:
   obtaining, by a signal processing unit, each of m excitations applying to each of m user ports, where m is an integer greater than or equal to 2 and where n is an integer greater than or equal to 2;
   estimating, by the signal processing unit, q real quantities based on a first impedance matrix of the target ports, where q is an integer greater than or equal to m, using sensing output signals obtained for the m excitations, and transmitting, by a signal processing unit, tuning control signals corresponding to q real quantities, to at least one impedance device among p impedance devices included in the multiple-input-port and multiple-output-port tuning unit, where p is an integer greater than or equal to m, at the predetermined frequency, each of the p impedance devices has a reactance, a reactance of a impedance device among the P impedance devices has an influence on a second impedance matrix presented by the user ports; and
   transmitting, by a tuning control unit, each of the tuning control signals to the at least one impedance devices, wherein the reactance of each of the at least one impedance device is determined based on the tuning control signal.

2. The method of claim 1, wherein the m excitations are applied successively to the user ports.

3. The method of claim 1, wherein each of the excitations having one and only one complex envelope, m complex envelopes are linearly independent in a set of complex functions of one real variable, regarded as a vector space over a field of complex numbers.

4. The method of claim 3, wherein the m excitations are not applied successively to the user ports.

5. The method of claim 3, wherein two or more of the excitations are applied simultaneously to the user ports.

6. The method of claim 1, wherein if the first impedance matrix is a diagonal impedance matrix at the predetermined frequency, the second impedance matrix is determined based on the reactance of the impedance device.

7. The method of claim 6, wherein if the first impedance matrix is the diagonal impedance matrix, at least one non-diagonal entry of the second impedance matrix is determined based on the reactance of the at least one impedance device.

8. The method of claim 1, wherein if n=m, and the multiple-input-port and multiple-output-port tuning unit comprises n single-input-port and single-output-port tuning units, two or more of impedance devices are included in each of the n single-input-port and single-output-port tuning units.

9. The method of claim 1, wherein the at least one sensing unit output signal comprises a first sensing unit output signal proportional to a first electrical variable, the first electrical variable being a voltage across one of the target ports, and a second sensing unit output signal proportional to a second electrical variable, the second electrical variable being a current flowing out of one of the target ports.

10. The method of claim 1, wherein at least one sensing unit output signal comprises a first sensing unit output signal proportional to a first electrical variable, the first electrical variable being an incident voltage at one of the target ports, and a second sensing unit output signal proportional to a second electrical variable, the second electrical variable being a reflected voltage at said one of the target ports.

11. An automatic tuning system for adjusting a multiple-input-port and multiple-output-port tuning unit in an automatic tuning system allowing, at a predetermined frequency, a transfer of power from m user ports to n target ports, where m is an integer greater than or equal to 2 and where n is an integer greater than or equal to 2, the automatic tuning system comprising:
   at least n sensing units configured to transmit at least one sensing unit output signal, each of the at least one sensing unit output signal being determined by one or more electrical variables;
   a signal processing unit configured to obtain each of m excitations applying to each of m user ports, where m is an integer greater than or equal to 2 and where n is an integer greater than or equal to 2, estimate q real quantities based on an impedance matrix of the target ports, where q is an integer greater than or equal to m, using the at least one sensing unit output signals obtained for the m excitations applied to the user ports, and transmit tuning control signals corresponding to at least one impedance device among p impedance devices included in the multiple-input-port and multiple-output-port tuning unit;
   the multiple-input-port and multiple-output-port tuning unit comprising the p impedance devices, where p is an integer greater than or equal to m, at said the predetermined frequency, each of the p impedance devices has a reactance, the reactance of a impedance device among the P impedance devices has an influence on an impedance matrix presented by the user ports; and
   a tuning control unit configured to receive the tuning control signals from the signal processing unit, and transmit each of tuning control signals to the at least one impedance devices, wherein the reactance of each of the at least one impedance device is determined based on the tuning control signals.

12. The automatic tuning system of claim 11, wherein the m excitations are applied successively to the user ports.

13. The automatic tuning system of claim 11, wherein each of the excitations having one and only one complex envelope, m complex envelopes are linearly independent in a set of complex functions of one real variable, regarded as a vector space over a field of complex numbers.

14. The automatic tuning system of claim 13, wherein the m excitations are not applied successively to the user ports.

15. The automatic tuning system of claim 13, wherein two or more of the excitations are applied simultaneously to the user ports.

16. The automatic tuning system of claim 11, wherein the at least one sensing unit output signal comprises:
   a first sensing unit output signal proportional to a first electrical variable, the first electrical variable being a voltage across one of the target ports; and
   a second sensing unit output signal proportional to a second electrical variable, the second electrical variable being a current flowing out of one of the target ports.

17. The automatic tuning system of claim 11, wherein the at least one sensing unit output signal comprises:
   a first sensing unit output signal proportional to a first electrical variable, the first electrical variable being an incident voltage at one of the target ports; and
   a second sensing unit output signal proportional to a second electrical variable, the second electrical variable being a reflected voltage at said one of the target ports.

18. The automatic tuning system of claim 11, wherein if the first impedance matrix is a diagonal impedance matrix at the predetermined frequency, the second impedance matrix is determined based on the reactance of the impedance device.

19. The automatic tuning system of claim 18, wherein if the first impedance matrix is the diagonal impedance matrix, at least one non-diagonal entry of the second impedance matrix is determined based on the reactance of the impedance device.

20. The automatic tuning system of claim 11, wherein if n=m, and the multiple-input-port and multiple-output-port tuning unit comprises n single-input-port and single-output-port tuning units, two or more of the impedance devices are included in each of the n single-input-port and single-output-port tuning units.

* * * * *